United States Patent
Kaiser et al.

(12) 
(10) Patent No.: US 6,495,199 B1
(45) Date of Patent: Dec. 17, 2002

(54) METHOD FOR DEPOSITION OF A VISCOUS MATERIAL ON A SUBSTRATE

(75) Inventors: Clement Kaiser, Montauban (FR); Francis Bourrieres, Montauban (FR)

(73) Assignee: Novatec S.A., Montauban (FR)

( * ) Notice: Subject to any disclaimer, the term of this patent is extended or adjusted under 35 U.S.C. 154(b) by 140 days.

(21) Appl. No.: 09/696,412

(22) Filed: Oct. 25, 2000

Related U.S. Application Data

(62) Division of application No. 08/949,577, filed on Oct. 14, 1997, now Pat. No. 6,171,399.

(30) Foreign Application Priority Data

| Oct. 15, 1996 | (FR) | 96 12671 |
| Jan. 28, 1997 | (FR) | 97 01033 |
| Oct. 13, 1997 | (WO) | WO98/163 |

(51) Int. Cl.[7] .................................. B05D 1/32
(52) U.S. Cl. ........................ 427/96; 427/282; 427/356
(58) Field of Search ..................... 427/96, 272, 282, 427/376–2, 356; 101/129, 123; 118/406, 410, 504

(56) References Cited

U.S. PATENT DOCUMENTS

| 4,604,966 A | * | 8/1986 | Kohn |  |
| 4,622,239 A | * | 11/1986 | Schoenthaler et al. |  |
| 5,287,806 A |  | 2/1994 | Nanzai |  |
| 5,309,837 A |  | 5/1994 | Nanzai |  |
| 5,478,700 A |  | 12/1995 | Gaynes et al. | 430/315 |
| 5,483,879 A |  | 1/1996 | Tani et al. |  |
| 5,579,690 A |  | 12/1996 | Tani et al. |  |
| 5,590,596 A |  | 1/1997 | Tani et al. |  |
| 5,746,127 A | * | 5/1998 | Fischbeck et al. |  |
| 5,988,060 A |  | 11/1999 | Asai et al. | 101/123 |

FOREIGN PATENT DOCUMENTS

| CH | 521175 | 5/1972 |
| CH | 547705 | 4/1974 |
| CH | 648 497 A5 | 12/1978 |
| CH | 648497 | 3/1985 |
| DE | 2250092 | 4/1974 |
| DE | 3115399 | 4/1982 |
| DE | 3150936 | 6/1983 |
| DE | 3226904 | 1/1984 |
| EP | 0565151 | 10/1993 |
| EP | 0626259 | 11/1994 |

(List continued on next page.)

Primary Examiner—Fred J. Parker
(74) Attorney, Agent, or Firm—Orrick, Herrington & Sutcliffe LLP

(57) ABSTRACT

A method and apparatus for carrying out the deposition of a paste like and/or viscous material, such as solder paste, on a substrate through the apertures or openings of a stencil are provided for use, for example, in screen printing in the mounting of components on a printed circuit board. A hollow receptacle for the material is provided with a lower aperture which is orientated towards the stencil. The lower aperture of the receptacle is delimited defined such that its length is adjusted to the dimensions of the substrate and that its width is a function of the speed of execution of the screen printing. This delimitation is implemented by sealing members preferably comprising two wipers on respective sides of the aperture, transverse with respect to the direction of displacement of the receptacle, orientated one towards the other and inclined with respect to the horizontal between the wipers at an angle of between 120° and 180°. The wipers are transversal and intersecting with the section of the receptacle. A pressure is exerted upon the viscous material in the receptacle. This pressure pushes the material towards the stencil between the wipers to distribute it over the stencil, and pushes the product upon the wipers, applying pressure to the wipers in order to push the wipers onto the stencil. The receptacle is displaced across the stencil at the same time that the pressure is exerted on the material.

26 Claims, 19 Drawing Sheets

FOREIGN PATENT DOCUMENTS

| | | |
|---|---|---|
| EP | 0699482 | 3/1996 |
| GB | 1433957 | 4/1976 |
| GB | 2257386 | 7/1995 |
| GB | 2279899 | 7/1995 |
| JP | 62-81092 | 4/1987 |
| JP | 5-57870 | 3/1993 |
| JP | 7-202399 | 8/1995 |
| JP | A-8-48024 | 2/1996 |
| WO | 9620088 | 7/1996 |
| WO | 96/20088 | 7/1996 |
| WO | 98/16387 | 4/1998 |

* cited by examiner

METHOD FOR DEPOSITION OF A VISCOUS MATERIAL ON A SUBSTRATE

This is a division of application Ser. No. 08/949,577, filed Oct. 14, 1997 now U.S. Pat. No. 6,171,399.

FIELD OF THE INVENTION

The present invention relates to a method and apparatus for carrying out the deposition of a viscous material on a substrate through the apertures of a stencil or screen, and may be used in a screen printing machine for the deposition of solder paste on a printed circuit board.

BACKGROUND

As is known, a substrate such as a printed circuit board on which electronic components are placed requires that the components be soldered to the board. A viscous material, such as a non-conductive or conductive adhesive solder paste or another silicon type viscous material is often deposited on the substrate before the component is placed on the substrate. Screen printing machines that are commercially available from a number of sources are used to automatically deposit the viscous materials through a screen or stencil onto the substrate. The screen or stencil can be either of the traditional type, that is to say a mesh or metallic stencil, or of the type which is the subject-matter of WO 96/01743 of the assignee of the present invention, relating to a stencil allowing the deposition of the materials to be applied.

Examples of the implementation of the present invention provided herein are within the area of deposition by screen printing of solder pastes such as are used in the electronics industry to produce printed circuit boards by soldering of components onto the boards. Nevertheless, the present invention can find application in other technical fields where viscous materials are used.

Generally, the solder pastes used in screen printing in the electronics industry are heterogeneous materials, the components of which have different densities, and are composed of metallic materials and organic or flux materials. The mass of the metallic portion of the solder paste represents approximately 85% to 90% of the total mass, with a density of 8 to 12 according to the metals used. It is understood that the term density means the weight as compared to 1 liter of water. In volume, the metallic portion represents only approximately 50% of the total volume. The organic material, also called flux, has a density of approximately 1.

The solder pastes described above are made up of metallic microspheres joined by the flux or organic material. This viscous flux comprises rheologic agents, adhesive agents and cleaning agents which affect the process of assembling components on printed circuit boards. The process, which is well known, involves:

deposition by screen printing of solder paste contacts onto selected portions of the substrate;

placing of component leads on the paste contacts, the adhesive agent of which holds the components to the board; and reflowing the solder paste in a furnace or oven, which causes the coalescence of the metallic microspheres, and, when cooled, results in the component being fixed on the board at the proper location.

The function of the alloy included in the solder paste is to provide the supply of metal necessary to ensure electrical interconnection between the leads of the components and the printed circuit by soldering. The organic materials in the paste must disappear at the conclusion of the soldering operation. Nevertheless, there is normally a residue of the organic materials which must be cleaned with water or with solvent, which is both costly and polluting.

Solder pastes reportedly having low residue have been developed. In these pastes, the organic part has substantially the same value in volume terms as in the previous pastes described above. Light solvents with low boiling points can be introduced to provide proper rheology or flow characteristics. Because of this, these solvents become volatile more rapidly during a preheating step, which generally precedes the reflow step described above during the assembly of components onto printed circuit boards. At the end of the reflow step there thus remains little residue. In order to provide a satisfactory adhesive capacity, the light solvents described above are combined with adhesive resins, which become volatile or sublimate in the reflow step.

The cleaning agents for preparation of a surface which is suitable for obtaining satisfactory inter-metal connections occupy a very small part of the total volume of the paste, in order to reduce the residue. As the overall efficiency of the cleaning must not change, the volume efficiency of the active cleaning constituent has to increase in the same proportions as the total amount of residue diminishes.

These developments in low residue solder pastes result, on the one hand, in a greater dilution of the active cleaning constituents in the paste and, on the other hand, in a greater volatility of the additional solvents used. It is therefore necessary that an extremely homogeneous distribution of the active cleaning constituent be obtained within the volume of each deposit when the solder paste is applied to the substrate. If this is not achieved, deposits of the solder paste will be obtained in which the efficacy of cleaning, for example, will not be identical for adjacent areas. Certain areas will have too much cleaning constituent applied, resulting in cleaning and residue problems. Other areas will not have sufficient cleaning constituents, and therefore the soldering obtained will be of poor quality.

The high degree of solvency and solubility of the additional solvents used results in the evaporation thereof while printed circuit boards are produced. In prior art modes of deposition, the material is dragged by means of an inclined wiper (see the prior art system shown in FIG. 1) in the open air and therefore the evaporation problem is not solved. The evaporation results in a change in the rheology of the solder paste during production, which leads to the parameters for control of the machine being modified. In extreme cases, the solder paste may become too dry and no longer pass properly through the apertures in the stencil.

These problems are exacerbated when production requirements necessitate high-speed screen printing, for example at 200 millimeters per second as opposed to 20 to 50 millimeters per second. To counteract these problems, thixotropic additives are introduced and combined with the other solvents. Evaporation of the base solvents therefore modifies the possible speed of deposition. By way of example, an evaporation of 1% from the volume of solder paste completely changes the rheology and makes screen printing very difficult, if not impossible.

Another of the problems caused by the known technology is the control of the wear and tear on the wiper system. Progressive erosion of the active edge of the wiper by rubbing alters the intrinsic qualities of the paste applied, and that of the depositions, because of the uncontrolled and random retrieval of a certain quantity of microspheres of the metallic portion of the solder with each wipe. In fact, the wipers are normally only changed when the poor quality of the deposition is a noticeable consequence of their wear.

In the prior art, two types of wipers have been commonly used. The first type of wiper is a rubber or polyurethane type. The hardness of this type of wiper varies generally between 70 to 90 Shore. This wiper has the advantage of good deformation by virtue of its low degree of hardness and its flexibility, and therefore good sealing is produced. It has the inconvenience of deforming during passage over the apertures in the stencil. For apertures where the dimension parallel to the wiper is less than 0.5 mm, this is not a major problem. However, where the apertures have dimensions parallel to the wiper greater than this value, the deposit is hollowed out. Where deposits are larger than 3 mm, they are completely dragged off again.

The second type of wiper is a metallic type. The advantage of this type of wiper is its ability to maintain rigidity and therefore not allow the deposit to be hollowed out. The hardness of this type of wiper, however, despite its flexibility, does not allow for perfect sealing with the stencil. The hardness of the metallic wiper sometimes exceeds that of the stencil and therefore often scratches the stencil resulting in encrustation of solder microspheres. The excessive pressure of the metallic wiper can also cause crushing of the tinlead spheres, this alloy being much softer than the steel wiper.

FIG. 1 shows a prior art implementation for depositing a viscous material onto a substrate 1 through a stencil or a screen 2 provided with apertures or openings 3, by means of a wiper 4. The material to be deposited is labeled 5.

In FIG. 1, standard wiper 4, inclined at an angle which can vary from 60° to 45° with respect to the substrate 1, fulfils at least two functions at the same time. First, it drags the material to be deposited over the stencil (in FIG. 1, in the direction of the arrow 4A). Second, it transfers the material through the apertures or openings 3 in the stencil or screen 2.

The force of transfer, however, can only be exerted if there is displacement of the wiper 4. Furthermore, this force is not constant over the whole length of the wiper 4, but rather is at its maximum at the ends of the wiper 4 and decreases along the length thereof. Because of this differential in force, the result of the transfer is directly linked to the viscosity of the material (which changes quickly), the force of transfer resulting from the sloping of the wiper 4, and from the movement of the wiper 4.

At the point of contact between the wiper 4 and the stencil 2, the wiper 4 fulfils three functions: (1) sealing between the stencil and the wiper; (2) wiping the stencil 2, which allows removal of the surplus material; and (3) contact between the stencil 2 and the substrate 1, there being no contact downstream and upstream of the wiper 4.

The fact that a single wiper 4 fulfils all of these functions makes independent action with respect to each of these functions impossible within the prior art technology. Moreover, the prior art technology has several disadvantages. Referring to FIG. 1, the material to be distributed through the apertures 3 is always downstream of the wiper 4. As a result, as shown in FIG. 1, when the filling of the aperture 3 takes place, it is always in a zone where the stencil 2 is not in contact with the substrate 1. Therefore, the material can be pushed in between the stencil 2 and the substrate 1 (designated as item 5A in FIG. 1), making on the one hand undesirable lines on the substrate 1, and on the other hand fouling the stencil 2, which must be cleaned frequently.

WO 96/20088 filed the Ford Motor Company relates to a method and an apparatus for distributing a viscous material by compression thereof through the apertures of a stencil. The apparatus comprises a reservoir receiving a charge of viscous material; a pressure is exerted on the viscous material in the reservoir. The reservoir is linked via a conduit to a distribution nozzle or compression head having a conical internal shape with baffle plates. The distribution nozzle is provided with a rectangular distribution slit delimited by two wipers disposed in opposite directions, slightly inclined with respect to the vertical. The two wipers bear against the stencil and keep it in contact with the substrate in the zone between them. The aim of this apparatus is to allow implementation of high-speed screen printing.

It appears that the technology disclosed by WO 96/20088 not only does not permit the resolution of the problems described previously, but moreover accentuates them. Indeed, the viscous material has to be placed in a reservoir which is an integral part of the system. The viscous material must, following the reservoir, be pushed under pressure towards the nozzle. The system according to WO 96/20088 has disadvantages, in particular with regard to the cleaning of the conduit from the reservoir to the nozzle. Further, the conical internal shape of the nozzle and the baffle plates with which it is provided, in theory provided to guide and equalize the pressure, will have the effect of laminating the paste. Such an effect is hardly compatible with the heterogeneous nature of the paste and the difference in density of the metallic parts and of the flux. Furthermore, this laminating creates a significant risk of separating the components of the paste and thus results in deposits of unequal quality. In addition, according to WO 96/20088, the nozzle and wipers bear upon the stencil either under the effect of a pressure independent of the pressure applied to the material in the nozzle or under the effect of springs acting on the wipers.

SUMMARY OF THE INVENTION

The present invention provides a method and apparatus for carrying out the deposition of a viscous material on a substrate through the apertures of a stencil or screen which allow the above problems to be solved.

According to an aspect of the invention, an apparatus for depositing a viscous material onto a substrate through openings formed in a stencil positioned over the substrate, includes a receptacle having a top and a bottom, and first and second longitudinal sides opposite one another for holding the material, the bottom having an aperture; a piston movable within the receptacle between the top and the bottom of the receptacle for applying a pressure to move the material toward the aperture; and a first wiper attached to the bottom of the receptacle at the first longitudinal side and a second wiper attached to the bottom of the receptacle at the second longitudinal side, wherein the first and second wipers are inclined at an angle with respect to a plane that is parallel to the bottom of the receptacle and wherein when the material is moved toward the aperture, the material is pushed against the first and second wipers and the first and second wipers are pushed against the stencil.

According to another aspect of the invention, a method for depositing a viscous material onto a substrate through openings formed in a stencil positioned over the substrate includes placing the material into a receptacle having a bottom and first and second longitudinal sides, the bottom having an aperture; providing a first wiper attached to the bottom of the receptacle at the first longitudinal side and a second wiper attached to the bottom of the receptacle at the second longitudinal side, wherein the first and second wipers are inclined at an angle with respect to a plane that is parallel to the bottom of the receptacle; applying a pressure and moving the material toward the aperture, wherein when the material is moved toward the aperture, the material is pushed against the first and second wipers and the first and second wipers are pushed against the stencil; and displacing the receptacle and the first and second wipers along the stencil in a direction substantially perpendicular to the first longitudinal side of said receptacle.

According to another aspect of the invention, a cartridge for holding solder paste for use in an apparatus for depositing solder paste onto a substrate through openings formed in a stencil positioned over the substrate, wherein the apparatus for depositing solder paste has means for applying pressure downwardly on the material in the cartridge, includes a lower portion having a plurality of apertures at the bottom thereof; and an upper portion that allows for the means for applying pressure to move the material toward the plurality of apertures; wherein when pressure is applied downwardly on the material by the means for applying pressure in the apparatus, the material passes through the aperture and through the openings in the stencil.

The present invention allows for the various functions to be separated from one another, that is to say the dragging of the viscous material, the transfer of the viscous material and the wiping of the excess viscous material, while providing enhanced sealing and quality of deposits, and also providing solutions with regard to the problems posed by the variations in rheology of the material or by its heterogeneous nature.

A method for making deposits of a viscous material on a substrate through the apertures in a stencil or screen according to the present invention involves containing a quantity of viscous material in a hollow receptacle. This hollow receptacle and its members and accessories, which will be described later, is designed as a disposable or recyclable container (for factory filling) delivered directly from the factory with a quantity of viscous material therein to be deposited. This arrangement avoids the necessity of handling the bulk viscous material, for example by using a spatula, from the pot in which it is traditionally delivered. As the apparatus is designed to be installed directly onto a screen printing machine for producing circuit boards, it can be removed either when it is empty or after use.

According to a method of the present invention, a pressure is exerted on the viscous material, which causes the material to be pushed towards a lower aperture in the receptacle directed towards the stencil. The length of this aperture is preferably adapted to the dimensions of the substrate on which the different deposits are to be made, or of the zone of the substrate on which the deposits are to be made; the width of the aperture is adapted to the desired speed of displacement of the apparatus on the stencil and thus to the speed at which the screen printing is to be done. Thus, a high printing speed can be obtained without adding additives to the paste to modify the rheology of the paste.

The lower aperture of the receptacle containing the viscous or pasty material is delimited or defined by sealing and wiping members. The pressure exerted on the material in the receptacle contributes to exerting a pressure, by means of the sealing and wiping members, onto the stencil and the substrate. As described hereinafter, this pressure contributes both to making a zone of contact between the stencil and the substrate, and to pressurizing the sealing members and wiping off the excess material. In addition, the stencil and the circuit board are in contact with one another in the area between the wiping members where the material is being deposited, thus ensuring good transfer of the material through the apertures of the stencil without allowing the material to pass under the stencil (see item 5A in the prior art, shown in FIG. 1) and without excess material being left on the stencil. Because the apparatus moves laterally along the substrate, there remains an area of non-contact upstream following passage of the sealing and wiping members.

According to a method to be described, the pressure exerted in the receptacle on the material remains constant as far as the distribution aperture and contact with the stencil. This pressure in the apparatus is exerted by the material upon the sealing and wiping members which delimit or define the delivery aperture and are transverse to the direction of downward delivery of the material. This orientation contributes to increasing the sealing function.

Moreover, according to a method to be described, the surface of the material on which the pressure is exerted is larger than the distribution aperture delimited by the sealing and wiping members. A pressure is exerted by the material upon the stencil at the level of the aperture and a pressure is exerted by the material on the sealing and wiping members.

The uniformity of the amount of pressure exerted in the cavity of the receptacle or container, the internal walls of which are rectilinear and/or parallel, avoids dissociation of the components of the material because of differences in density of the components.

A method embodying the invention furthermore performs a homogenization step. This phase is carried out under the influence of the pressure exerted on the material in combination with a homogenizing member which will be described hereinafter. Preferably, this homogenization is obtained by dividing the material into parts of identical volume in the zone between the receptacle itself and the distribution aperture delimited or defined by the sealing and wiping members. The action of the wipers as the receptacle is displaced also assists this homogenization as discussed in detail below.

Furthermore, the invention includes a method and an apparatus which are directly adaptable, practically without modification, to existing screen printing machines. The invention eliminates the need to handle the material in the open air thereby avoiding undesired changes in the material.

Furthermore, as will be set out in the description of embodiments to follow, the apparatus may be useable as a consumable, thrown away after the viscous material it contains is used up, providing a solution to the problem of recycling by the suppliers of unused or incompletely used pots of pastes.

In one aspect, a method of deposition of a viscous material on a substrate through the apertures of a stencil or screen placed on the substrate is as follows:

the viscous material is placed in a hollow receptacle acting as the container and provided with a lower aperture orientated towards the stencil on which the receptacle rests, the receptacle being mounted on a screen printing machine;

the lower aperture of the receptacle is delimited or defined such that its length is adapted to the dimension of the substrate or of the zone of the substrate on which one or more deposits are to be made;

this delimitation or definition of the lower aperture is done by sealing members comprising at least one longitudinal flexible wiper which is transverse with respect to the direction of displacement of the receptacle, the wiper being transverse to the direction of displacement of the material towards the aperture and also being transverse to the direction of the pressure to which it is subjected, with the level of the delivery of the material at an angle of between 120° and 180°;

a pressure is exerted in the receptacle upon the material and it pushes the material towards the stencil to distribute it upon the flexible wiper by pressing on the flexible wiper to make it bear on the stencil and to make the stencil bear on the substrate. In addition, the receptacle is displaced laterally along the stencil.

The delimitation or definition of the lower aperture may be done by sealing members comprising at least two flexible wipers, each on either side of the opening, transverse with respect to the direction of displacement of the receptacle, each wiper being transverse with respect to the push exerted on the material, the wipers being orientated opposite to one another towards the aperture and having a slope with respect to the horizontal, in the zone of the aperture, of between 120° and 180°.

According to another embodiment of the invention, the pressure exerted in the hollow receptacle is constant from the piston to the distribution aperture.

According to another embodiment of the invention, the material exerts a pressure upon the wipers contributing to the sealing and to the forming of the contact between the stencil and the substrate.

According to another embodiment of the invention, the material is homogenized by mixing before the material reaches the aperture.

In one embodiment of the invention, the apparatus for deposition of a viscous material on a substrate through the apertures of a stencil placed on the substrate constitute a receptacle containing a quantity of material, the cavity: containing the material having parallel, rectilinear walls in which a piston moves. The material is pushed towards an aperture delimited by sealing members, for example, wipers orientated in opposite directions at an angle of between 120° and 180° with respect to the horizontal on the deposition side; in the case of wipers at 180°, the extremity thereof can be beveled or inclined towards the stencil.

According to another embodiment of the invention, a perforated grille is located in the receptacle above the aperture.

It appears that the invention makes use of a method and a apparatus particularly suitable for transferring a viscous material.

The efficacy of the system in transferring a viscous material through an aperture can be characterized by the following coefficient:

$$K = \text{contact time } (T) \times (PT) \text{ pressure of transfer} / (VI) \text{ viscosity}$$

T being the duration for which the material to be transferred is in contact with the aperture.

PT being the pressure to which the material to be transferred is subjected.

VI being the viscosity.

K is a non-unitary value which is proportional to the efficacy of the transfer.

The greater the value K, the more easily the material will be transferred.

DETAILED DESCRIPTION

Figure 2:
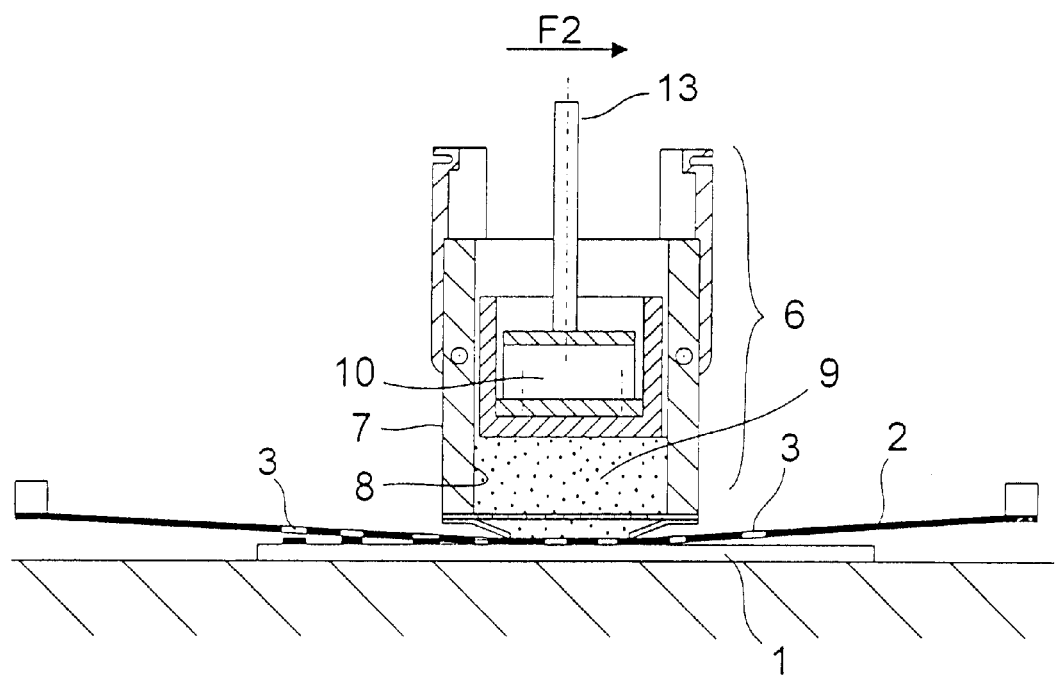
FIG. 2 is a view in transverse section of an apparatus embodying the present invention.
Figure 3:
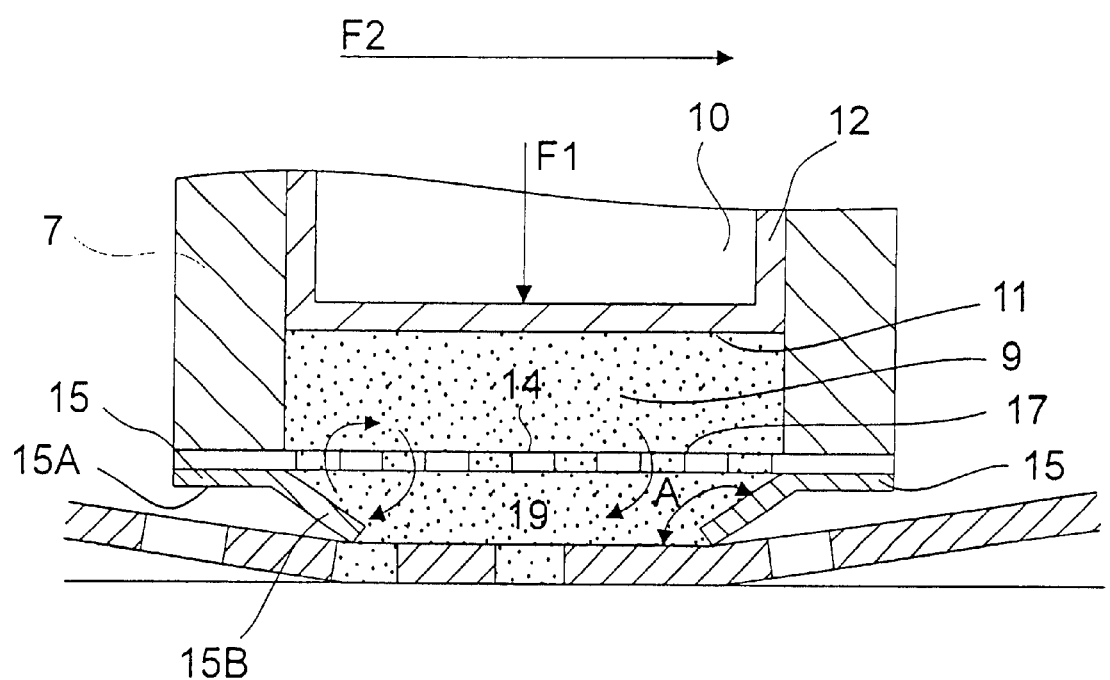
FIG. 3 is a view in transverse section of the apparatus shown in FIG. 2.
Figure 4:
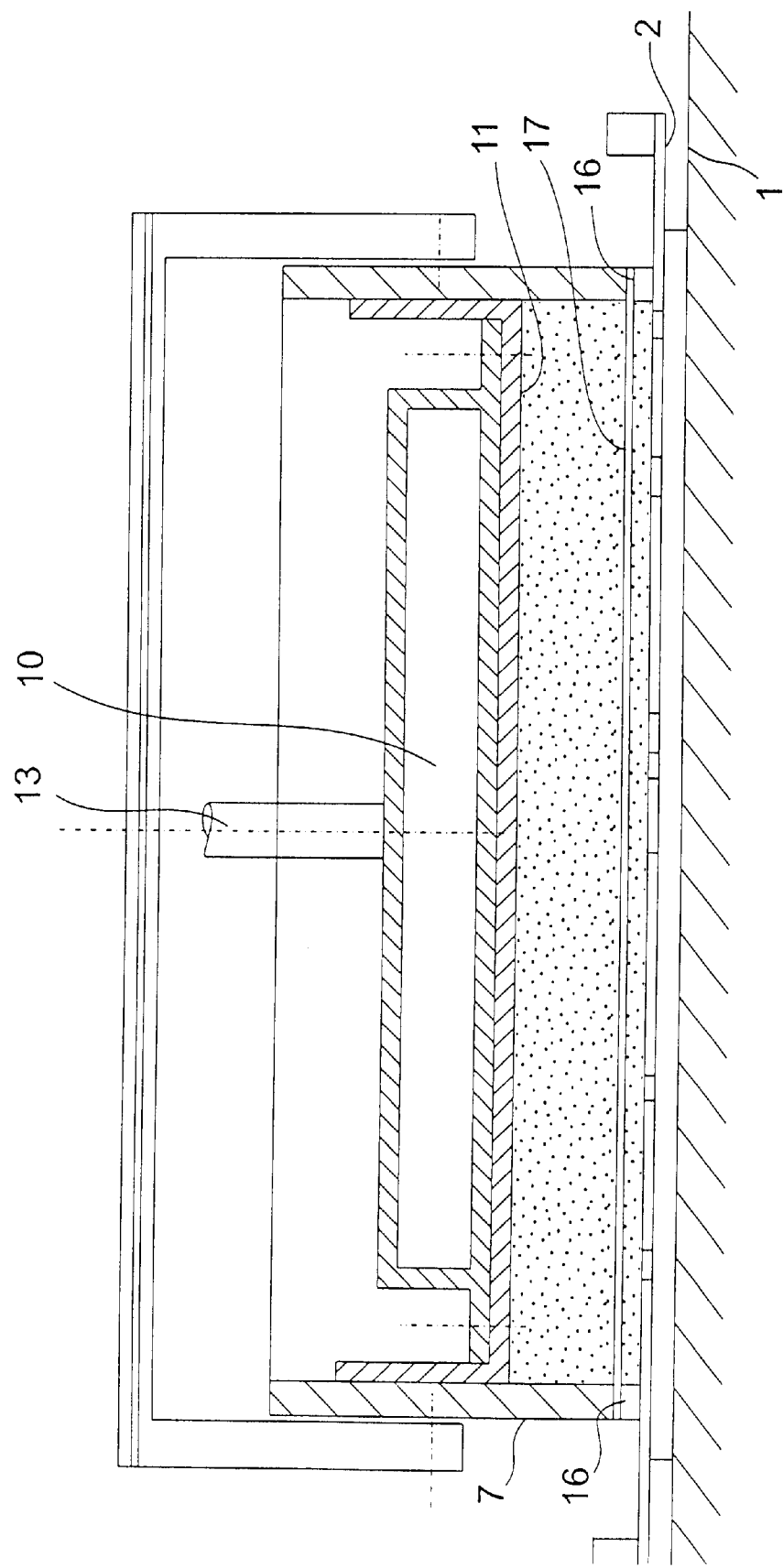
FIG. 4 is a view in longitudinal section of the apparatus shown in FIG. 2.

FIG. 2 shows a view in transverse section of an apparatus for implementing the present invention; this view is complemented by FIG. 3 which is a view in partial transverse section, and by FIG. 4 which is a view in longitudinal section.

FIG. 2 shows the substrate or printed circuit board 1, resting on a table, with stencil or screen 2 placed thereon, the screen 2 having apertures or openings 3. Also shown in FIG. 2 is the distribution apparatus 6 for the material. The distribution apparatus 6 includes a receptacle or container 7, the internal wall or walls of which is or are rectilinear and parallel. In the internal cavity of the receptacle 7, the walls of which are vertical, a quantity of material, for example solder paste (labeled 9) is placed. The material may be placed within the container 7 in the factory.

A piston 10 is movably mounted in the internal cavity of the receptacle 7. The piston 10 has a head 11 (FIG. 3), the surface of which is planar. It is provided with vertical walls 12 behind its planar head, which slide on the vertical wall or walls of the receptacle 7 and contribute to the guiding of the piston 10. A vertical pressure is exerted on a rod 13 of the piston 10 (FIG. 2) according to the arrow F1 of FIG. 3. This vertical pressure is delivered to the rod 13 of the piston 10 by a pressure source (not shown) and a member of the screen printing machine capable of transmitting this pressure. The pressure exerted upon the material 9 is uniform and constant throughout the receptacle 7 due to the rectangular cross sectional shape of the receptacle 7 containing the material 9 and the piston 10.

Figure 5:
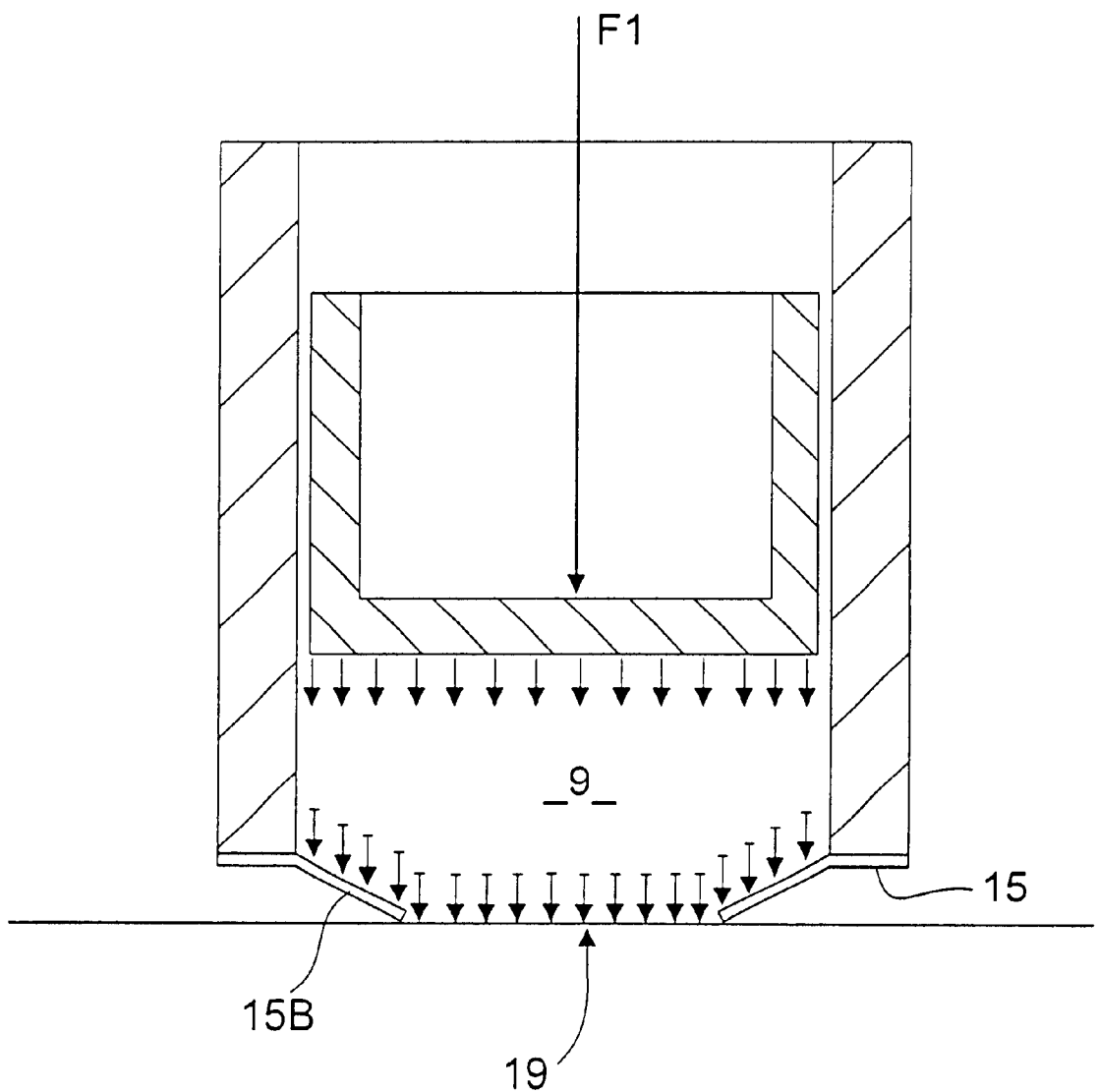
FIG. 5 shows, in a transverse section view, the pressures exerted within the apparatus and on the stencil and the substrate.
Figure 7:
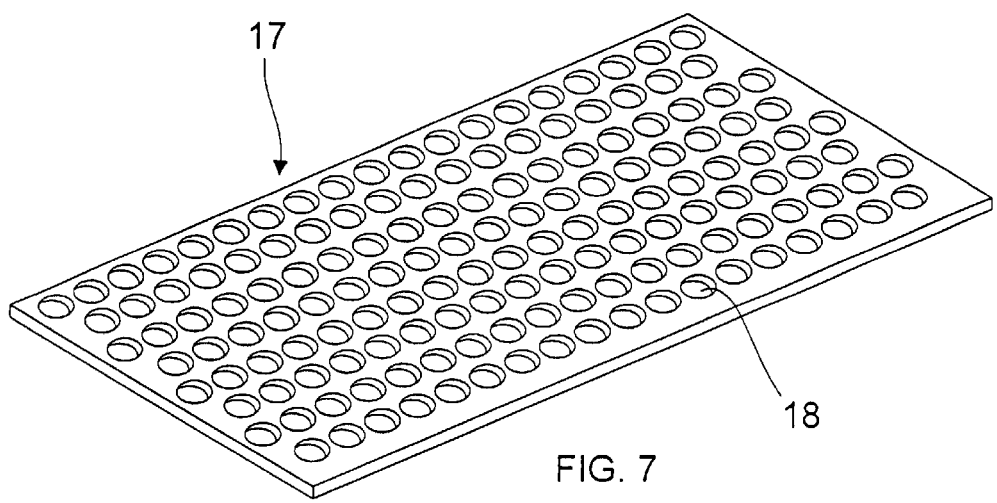
FIG. 7 is a perspective view of the grille shown in FIGS. 2–4, 6, 9 and 13.

Referring to FIGS. 3 and 5, the receptacle is open towards the bottom by means of a distribution aperture 19. Furthermore, sealing members 15 and 16 delimit or define the aperture 19. At the base of the receptacle 7 there is attached a member 17 for homogenization or mixing of the material by dividing the heterogeneous paste-like or viscous material. This member 17 is constituted by a perforated grille or by a perforated wall, the perforations of which are, as shown in FIG. 7, preferably all of the same size and made according to a constant spacing and pitch. The perforations 18 of the grille 17 in FIG. 7 are circular, but may be of other configurations. The grille 17 fulfils both a function of holding the solder paste or other material in the cavity of the receptacle 7 and also transmits the material onto the stencil 2 as the material is pushed by the piston 10. As the material is pushed by the piston 10, the material also exerts a downward pressure on the grille 17 resulting in a downward pressure on the sealing members 15 (described below).

Figures 8A, 8B:
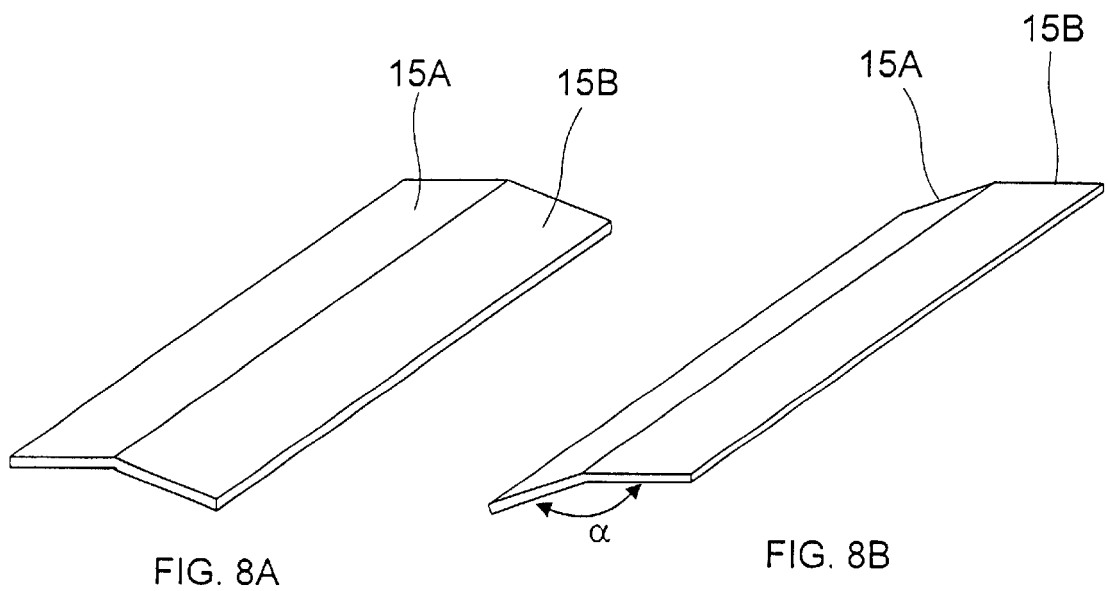
FIGS. 8A and 8B are a perspective views at different angles of the wipers shown in FIGS. 2,3,5,6,9, 12, and 13.

Below the grille 17 there are arranged the sealing members 15 and 16 which delimit or define the aperture 19 (FIG. 3) for delivering the material 9. The aperture 19 is of a smaller dimension than the receptacle 7 as shown in FIG. 3. The sealing or wiping members 15 are shown in FIGS. 2 and 3, and by themselves in FIGS. 8A and 8B. The sealing members 16 are shown in FIG. 4, which is a view in longitudinal axial section of the apparatus 6.

The sealing members 15, alternatively referred to herein as wipers, are fixed by a part 15A to the walls of the receptacle 7 (FIG. 3), and thus are also fixed to the grille 17, which is also fixed to the walls of the receptacle 7. The wipers 15 also include a part 15B (FIGS. 3 and 5) which is disposed at an angle relative to the lower section of the receptacle 7 and to the direction of descent of the material 9 under the pressure of the piston 10. The wipers 15 are mounted opposite one another, their inclined parts 15B facing one another and in opposite directions. As shown in FIG. 3, the angle of inclination A of parts 15B with respect to the horizontal in the zone of distribution of the material 9 onto the stencil 2 is greater than vertical, and can, for example, be between 120° and 180°. In the case in which parts 15B are inclined at 180°, its extremity can be beveled or inclined. The above described broad angle of inclination is important because it allows the material 9 to push down on the part 15B of the wiper 15 and push it against the stencil 2. The angle formed by parts 15B with respect to the horizontal outside of the zone where the material 9 is deposited is the complement of the value A, i.e., is 180°.

The wipers 15 can be of any suitable metal or synthetic material. However, they are preferably made of a hard, flexible material which is sufficiently deformable without exceeding the elastic limit of the material. Advantageously, wipers 15 such as described are arranged on the long longitudinal sides of the apparatus 6 and approach the stencil 2 and the substrate 1 transversally. Each wiper 15 has the function of lifting, by detachment, the excess material remaining on the stencil 2. This functioning is more efficient than in the prior art wiping apparatus (FIG. 1) in which the material is pushed by the wiper 4.

In one embodiment of the present invention, the transverse or short sides of the apparatus 6, which has the shape of a rectangular parallelepiped, can either be provided with wipers 15 providing sealing as described previously, or may be provided with sealing members 16 such as are shown in FIG. 4. Sealing members 16 can be a contoured section of a flexible material, or an elastically deformable contoured section which can, for example, be constituted by a contoured section which is hollow or made from closed cell foam. The function of the members 16 is that of lateral sealing, thus avoiding overflow of the material outside of the area delimited thereby.

In an alternate embodiment, the apparatus 6 of the present invention is provided with only one wiper 15 on a longitudinal side thereof, and with sealing members 16 on the other three sides thereof. In this case, the apparatus 6 could only function in one direction.

The piston 10 exerts a pressure (according to the arrow F1 in FIG. 3) on the paste like and/or viscous material 9. Together with this pressure, a displacement movement in the direction of the arrow F2 (FIG. 2), or in the direction opposite to the arrow F2, is provided to the apparatus 6 to allow it to cover the surface of the stencil 2 and of the substrate 1. The vertical pressure of the piston 10 in the receptacle 7 pushes the material 9 through the grille 17 and through the lower aperture 19 towards the stencil 2 and the substrate 1. At the same time, the vertical pressure pushes the material 9 onto the wipers 15, which contributes to keeping the portions 15B of the sealing or wiper members under pressure and also contributes to wiping off the excess material 9 by simultaneous displacement of the apparatus 6. As shown in FIG. 5, because the material 9 is pushed both against the wipers 15 and the stencil 2, a perfect contact between the stencil 2 and the substrate 1 is achieved.

The inclination of the parts 15B of wipers 15 as defined hereinabove contributes to detaching and lifting the excess material which remains in the zone delimited or defined by the grille 17 and the parts 15B of the wipers 15. As the wipers 15 are arranged in opposite directions relative to one another, this wiping function is performed regardless of the direction of displacement of the apparatus 6.

The grille 17 functions as a homogenizing or mixing element for the material 9, for example solder paste. In particular, the paste is divided as it is pushed downward due to the fact that the solder paste leaves the grille 17 in separate strings or small rods, corresponding to each of the perforations in the grille 17. The strings or rods are then re-agglomerated by rubbing on the stencil or screen 2. The open surface of the grille can be between 20% to 90% of the total surface thereof. In addition, the grille 17 can be removable and/or interchangeable according, for example, to the proportion of open surface which is desired.

The lower distribution aperture 19 can be of dimensions adapted according to the desired speed of application of the material 9 and/or of the viscosity of the material 9 to be deposited. The invention is applicable to the application of very high viscosity materials as well as to very low viscosity materials. The aperture 19 can be so adapted by varying its width, meaning the distance between the parts 15B of the wipers 15. It is also possible to envisage that the width of the receptacle 7 and of the piston 10 is different and more or less larger than the aperture 19 and that the relationship therebetween is adapted according to the particular rheology of the material 9. The length of the apparatus 6 and the length of the aperture 19 can be adjusted to cover the whole of the width of the substrate 1 and/or of the stencil 2 or of the zone of the stencil 2 on which the deposits are to be made.

Figure 6:
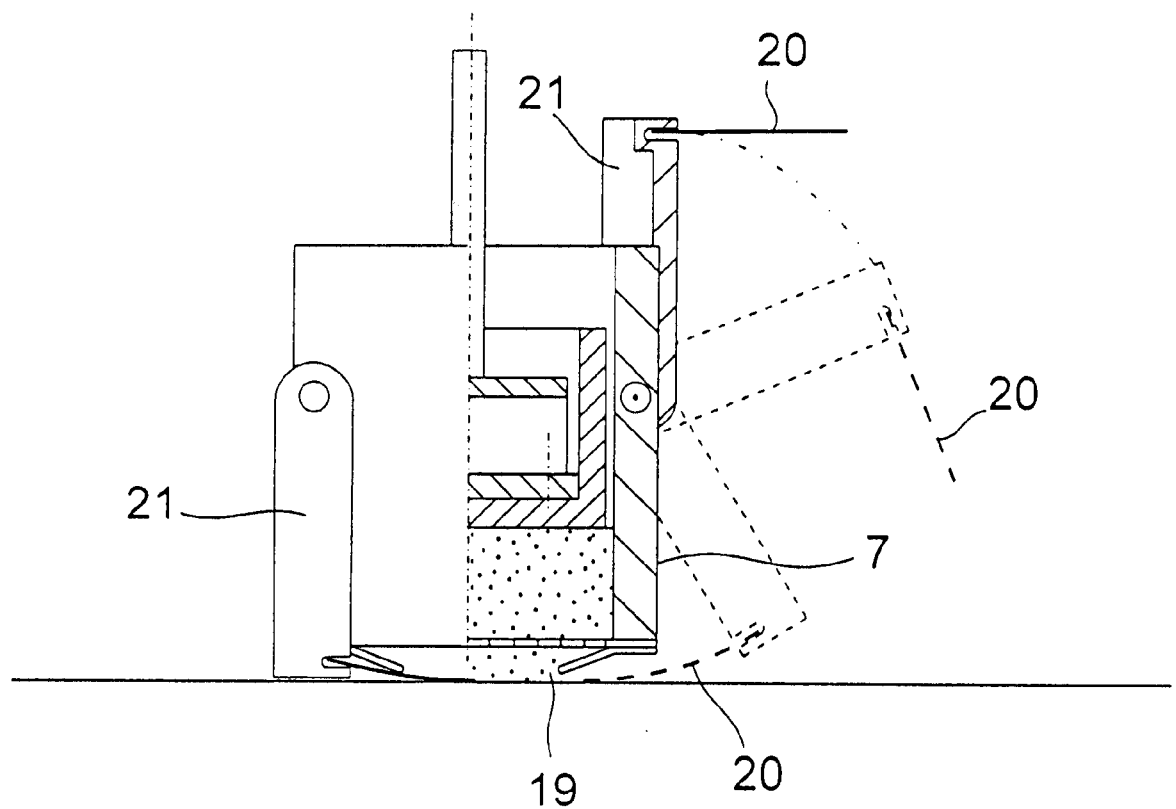
FIG. 6 shows a manner of engagement between the apparatus of FIGS. 2, 3, 4, 5, 10, and 12 and the stencil so that they may be separated from one another.

According to another embodiment of the invention, removal of the apparatus 6 from the stencil 2 and/or substrate 1 without spilling the material 9 is possible by interposing a wall between the wipers 15 and the material 9 on the one hand, and the stencil 2 on the other hand. Advantageously, as shown in FIG. 6, the receptacle 7 is provided with at least one wall 20. This wall 20 is carried by any suitable member which allows it to be positioned outside the field of the aperture 19, or below it. Preferably, this wall 20 is a flexible, rigid or semi-rigid wall acting as a blade. In the embodiment shown in FIG. 6, the wall 20 is carried by an articulated and moveable flap 21 in order to occupy the positions such as shown in broken lines. Preferably, the flap 21 is articulated on the external face of the receptacle 7, and is placed in the upper position during the phase of displacement of the apparatus 6. When it is desired to remove the apparatus 6 from the stencil 2, the flap 21 is articulated to the lower position such that it covers aperture 19 and prevents material 9 from exiting therefrom. In an alternate embodiment, the apparatus 6 comprises two walls 20 and two flaps 21 articulated on each of its external front and rear faces.

Figure 9:
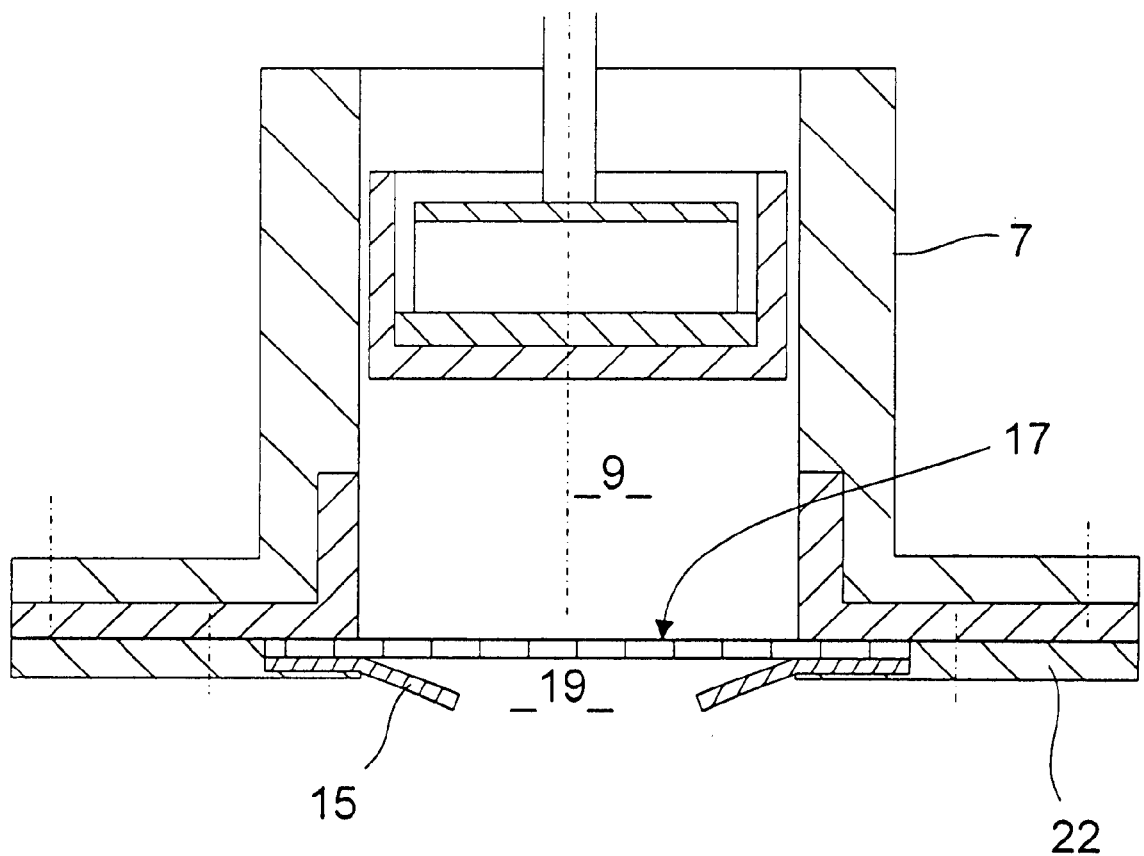
FIG. 9 shows a view in transverse section of another embodiment of the apparatus according to the invention.

FIG. 9 shows a view in transversal section of an embodiment of the apparatus 6 in which the grille 17 and the wiper or wipers 15 are carried by an apparatus 22 which can be fixed, such that it can be dismantled, below the receptacle 7. This embodiment allows the mounting and dismantling of the grille 17 and or the wiper or wipers 15 and the changing of one or the other of the grille 17 and the wipers 15.

The distribution apparatus 6 according to the present invention is designed to function in a sealed manner by contact with the stencil 2 which pushes against the substrate 1. This sealing allows materials which are sensitive to humidity, for example, silicones, to be used without prolonged exposure to air. Furthermore, the aperture 19 can be covered over by a cover (not shown) prior to use of the apparatus, which can be glued below the grille 17 and which can be peeled or torn off, which also prevents the material from being exposed to air for prolonged periods.

Figure 10:
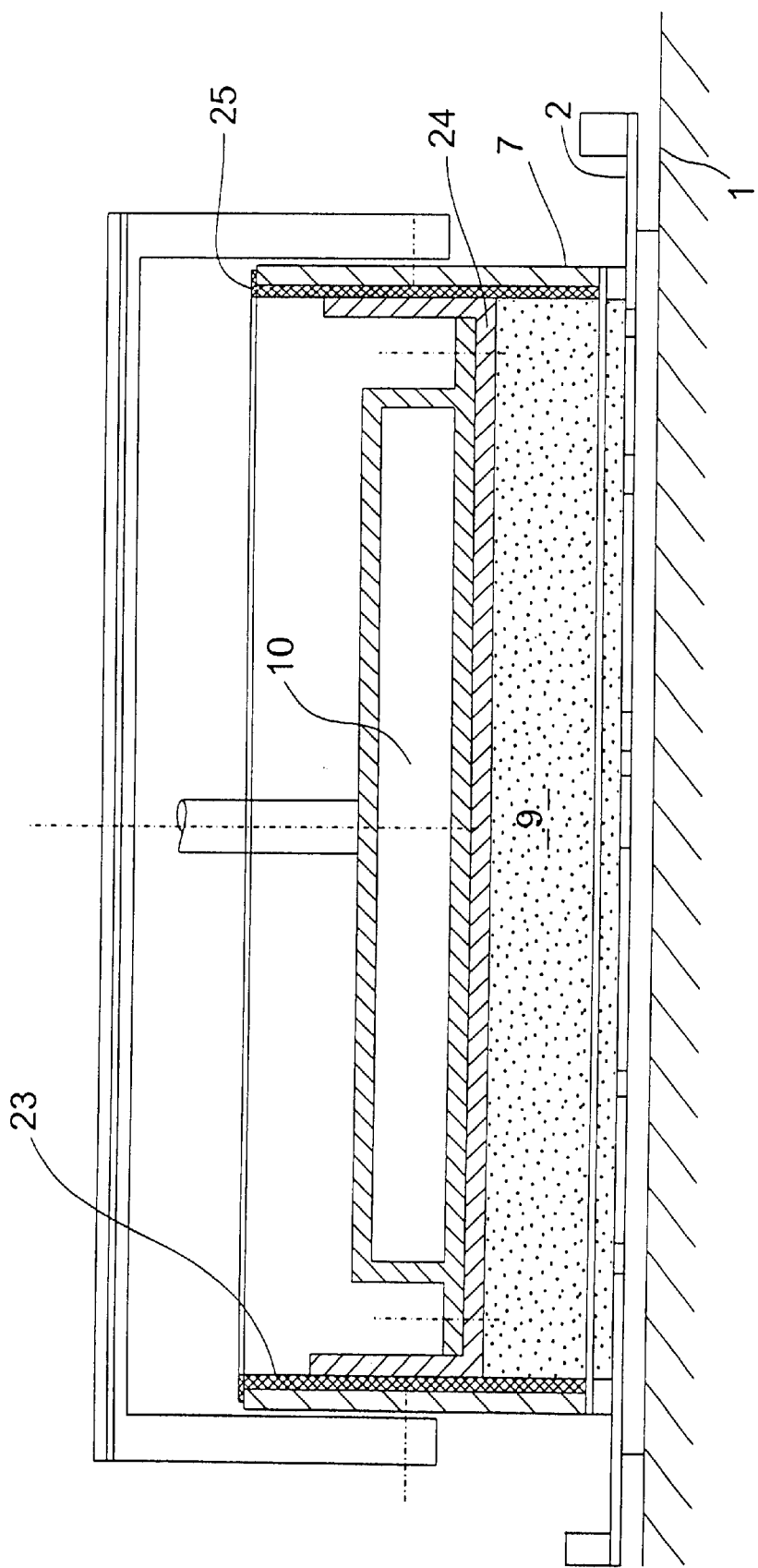
FIG. 10 is a view in longitudinal section of an apparatus for the deposition of a paste like or viscous material with an intermediate receptacle or cassette forming another aspect of the present invention.

FIG. 10 shows a view in longitudinal section of an embodiment of the apparatus for deposition of paste like or viscous material with an intermediate receptacle or cassette 23. The material 9 is contained in an intermediate receptacle or cassette 23 which is closed at the top with a sliding cover 24 (FIG. 11) and which is introduced into the cavity of the receptacle 7. The piston 10 pushes the material in this intermediate receptacle or cassette 23 by bearing on the sliding cover 24 pushing the cover down, thus pushing the material down. The intermediate receptacle or cassette 23 may be filled with a quantity of material 9 at the factory directly by the material manufacturer.

Figure 11:
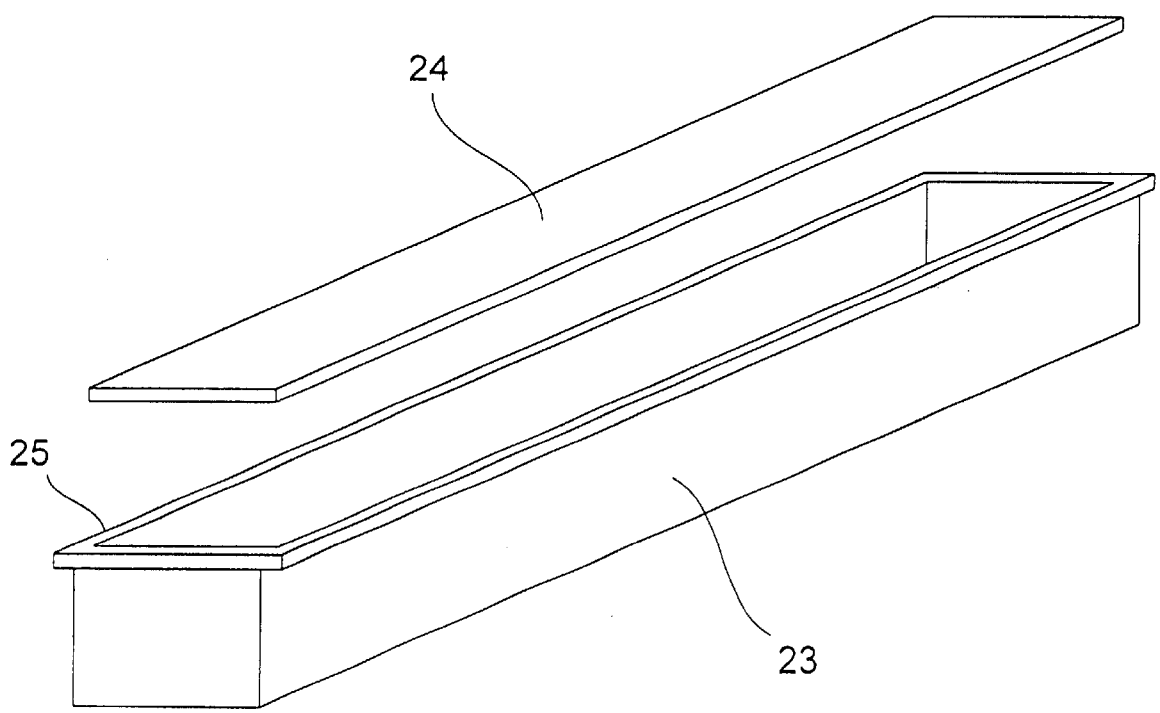
FIG. 11 is a perspective view of the intermediate receptacle or cassette of FIG. 10 with its cover.

The intermediate receptacle or cassette 23 is shown in FIG. 11 and has a shape corresponding to that of the internal cavity of the receptacle 7. The intermediate receptacle or cassette 23 has vertical walls and an aperture at the top and at the bottom. These apertures can be covered in the factory after filling by any known means and uncovered at the time of installation of the intermediate receptacle in the receptacle 7.

Preferably, the intermediate receptacle or cassette 23 is provided with a shoulder 25, totally or partially peripheral, on its top edge for anchoring the intermediate receptacle or cassette 23 to the receptacle 7. The intermediate receptacle or cassette 23 preferably has smooth and rectilinear internal walls. The intermediate receptacle or cassette 23 is designed as a disposable or recyclable cartridge. The cover 24 rests on the paste-like material and, as shown in FIG. 11, is a planar plate with dimensions slightly smaller than the top aperture of the intermediate receptacle or cassette 23 that it can slide in the intermediate receptacle or cassette 23 under the pressure of the piston 10 which pushes the material 9.

One advantage of this improvement is that it simplifies and makes less expensive the manufacture of the apparatus 6. Another advantage is that it facilitates the handling of the paste-like or viscous material and/or its mixing or heating prior to use. In particular, it eliminates the need to manually handle the material and load it into the apparatus 6.

Figure 13:
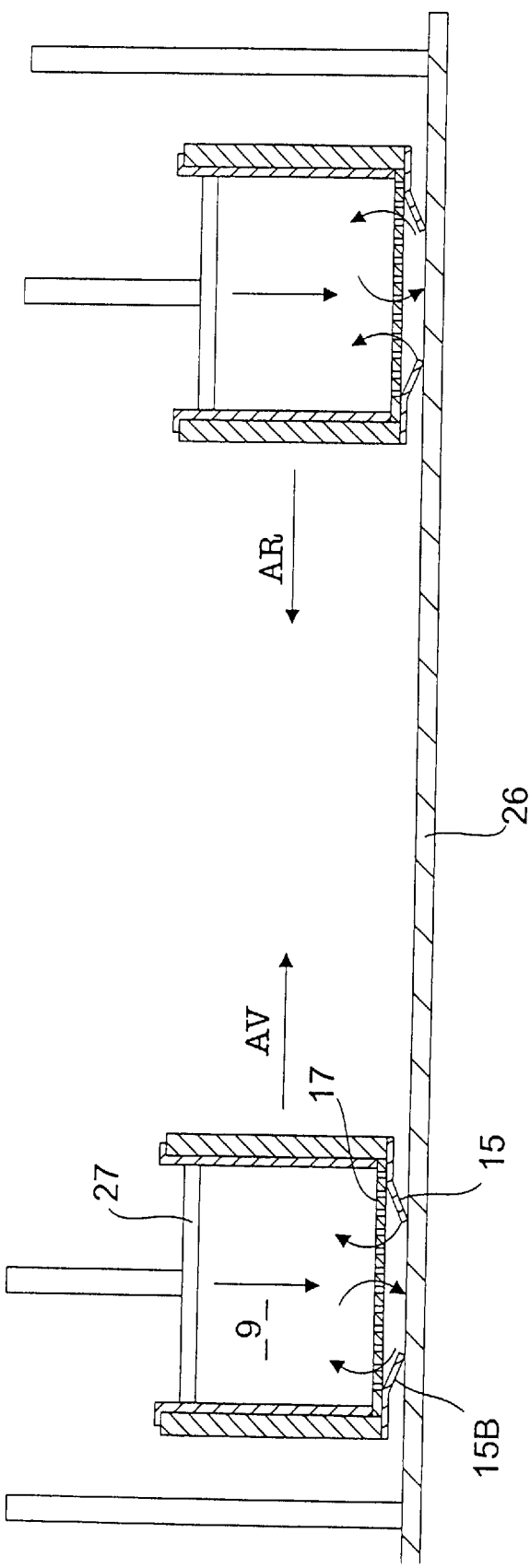
FIG. 13 is an apparatus for mixing the paste like or viscous material in another embodiment of the invention.

According to another embodiment of the invention, the intermediate receptacle or cassette 23 can integrate functions of the apparatus which receives it. In particular, as shown in FIG. 13, intermediate receptacle or cassette 23 can be provided at the level of the lower aperture thereof with an openwork grille 17 and its lower aperture can be delimited or defined by sealing members 15, the parts 15B of which are in opposite directions. This construction facilitates production because the grille 17 and the sealing members 15 can be moulded with the intermediate receptacle.

Figure 12:
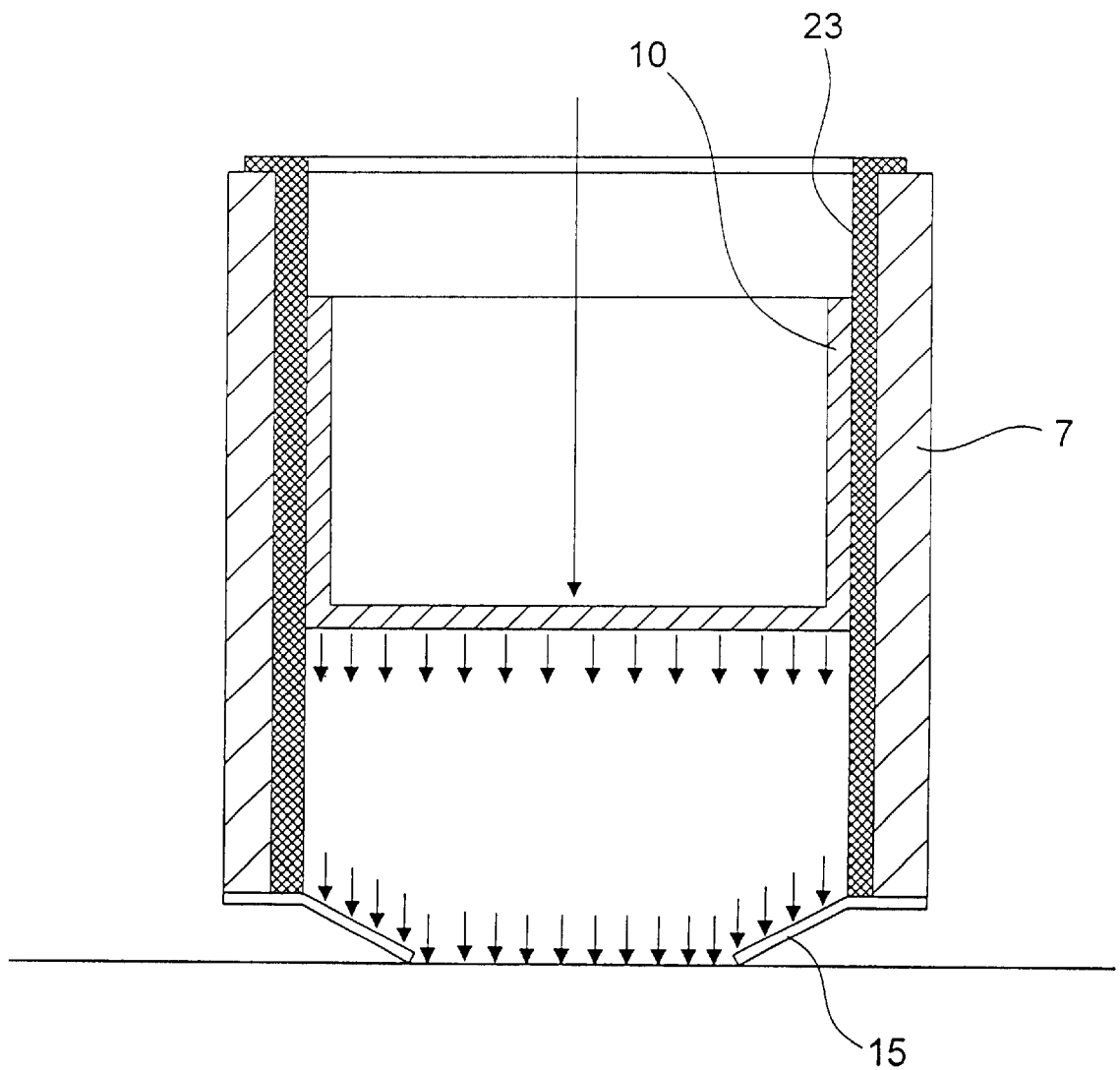
FIG. 12 is a view in transverse section of the apparatus according to FIG. 10.

FIG. 12 shows a material mixing apparatus which can be used in conjunction with the intermediate receptacle cassette 23 of the present invention before insertion in the receptacle 7 of the apparatus 6. It comprises a planar, preferably rigid, plate 26 under the aperture delimited by the sealing members 15, which is substituted for the stencil 2. The apparatus is guided, for example, by means of a rail (not shown) or any other mechanical means, parallel to the plate 26. A pressure is exerted by a piston 27, which can be of the same type as the piston 10, and which bears upon the material 9 and passes it through the grille 17.

The forward movement, that is to say from left to right in FIG. 13, causes the setting in motion and the rotation of the paste and its agitation and its homogenization at the time of passage through the apertures of the grille 17 in the clockwise direction. The backward movement, that is to say from right to left in FIG. 13, causes the setting in motion, the rotation and the homogenization of the paste in the opposite direction. Several forward-backward movements provide mixing of the solder paste, the wipers 15 lifting the paste as shown by the rotational arrows in FIG. 13, so that the paste passes upward through the grille 17 and is pushed back downward through the grille 17 by the piston 27. This action gives the paste the rheological qualities suitable for its application from the start of its use, whether for new cartridges or for cartridges which still contain some material and which have to be re-used after a downtime. It will of course be appreciated that this rotation and homogenization of the material, which is important to maintain the proper rheology of the paste, also occurs during displacement of the apparatus 6 during a printing operation as is shown by the rotational arrows in FIG. 3.

Furthermore, the apparatus embodying the invention does not require high working pressures.

As it is designed as a sealed container, the apparatus 6 of one embodiment of the present invention eliminates the cleaning operations that were necessary in connection with the prior art. Furthermore, the apparatus embodying the invention is healthier and safer to use because users do not have to come into direct contact with material 9.

According to the criteria of application and/or the nature of the materials to be deposited, a distribution apparatus 6 of one embodiment of the present invention can be insulated and/or provided with a thermostat, heated or cooled, without it being necessary to provide this insulation or conditioning for the whole machine, as was the case with the prior art.

Referring to FIGS. 14 through 19, alternative embodiments of the apparatus and the intermediate receptacle or cassette are shown. This alternative embodiment of the print head apparatus is commercially available for use with screen printing machines from DEK Printing Machines, Ltd., 11 Albany Road, Granby Industrial Estate, Weymouth, Dorset, England under the designation "ProFlow head", and the structure of the DEK ProFlow head is incorporated herein in its entirety by reference. An alternative embodiment of the intermediate receptacle or cassette is also commercially available from DEK Printing Machines Ltd. and is manufactured by Multicore Solders Ltd., Wood Lane End, Hemel Hempstead, Hertfordshire, England. This Multicore cassette, the structure of which is also incorporated in its entirety herein by reference, is designated by Multicore as the Multicore DISC.

Figure 14:
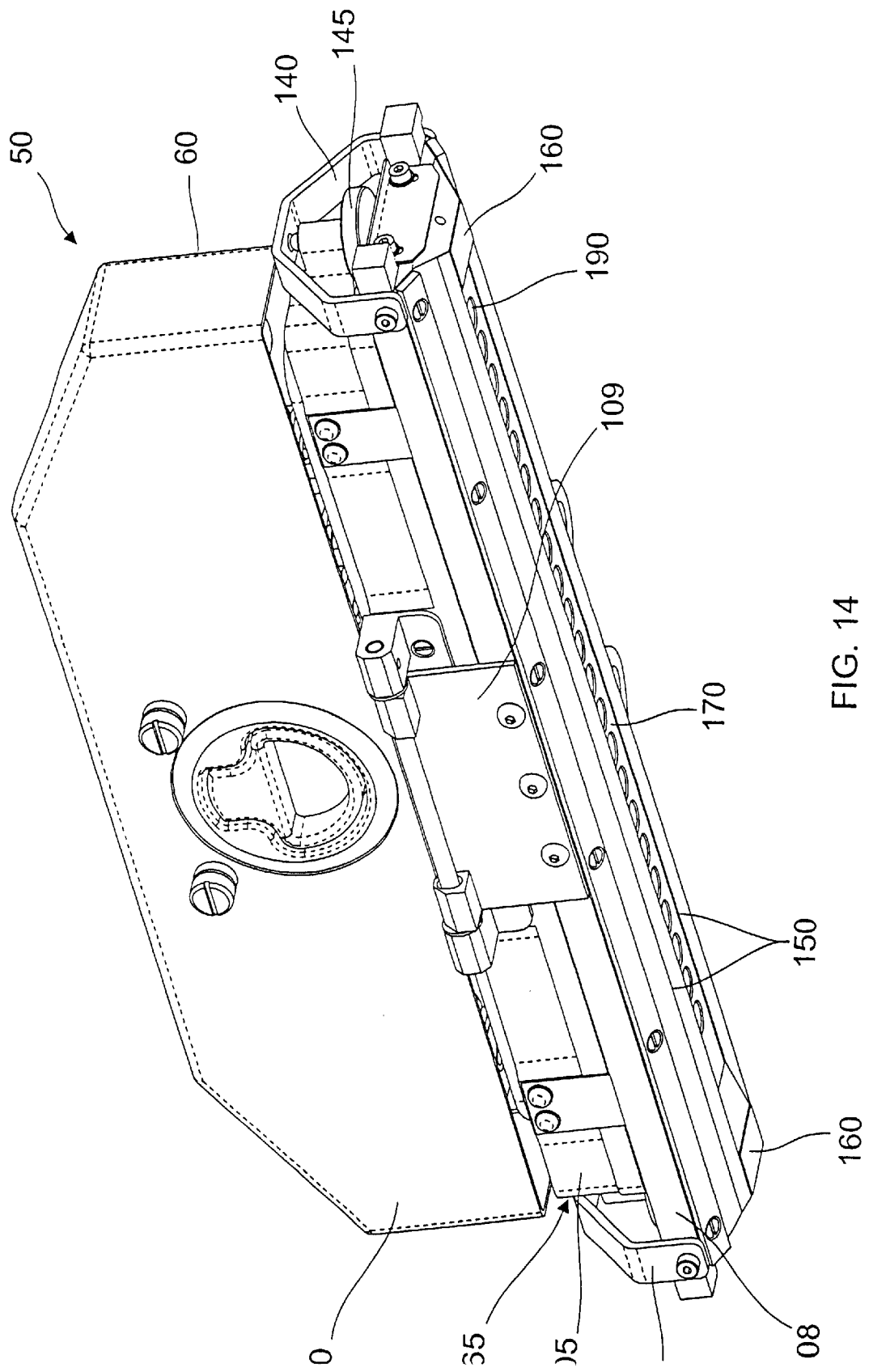
FIG. 14 is a perspective view of a commercially available embodiment of an apparatus for the deposition of a paste like or viscous material on a substrate in a screen printing machine where the apparatus is shown in the closed position.

FIG. 14 is a perspective view of the commercially available DEK ProFlow head designated as apparatus 50 wherein the apparatus 50 is in the closed position. FIGS. 15 through 18 are perspective views of the apparatus 50 in the open position which illustrate the steps of loading the commercially available Multicore DISC cassette 55 into the apparatus 50. This commercially available apparatus is used on DEK screen printing machines, including the DEK Model 265 screen printing machine.

The apparatus 50 includes two main parts described in detail below. The first part is the pressure assembly 60, which applies a force to the solder paste, and the second part is the transfer head 65, which contains the solder paste.

The pressure assembly 60 includes housing 70 which contains within it a piston or cross-head plate 75 (FIG. 15) and a suitable driving mechanism which includes two pneumatic cylinders 80 (FIG. 16) for selectively driving the cross-head plate 75 within the housing or cover 70 in a direction substantially parallel to the side walls thereof. By regulating the air pressure to the cylinders 80, a range of forces can be generated. This regulation function can be accomplished either manually through a manually adjusted regulator or automatically using software and an electronic regulator. The pressure assembly 60 is moveably attached to the transfer head 65 by way of mounting assembly 83 and hinge 85. Thus, the pressure assembly 60 is moveable between a closed position, shown in FIG. 14, and an open position, shown in FIGS. 15 through 18, by actuating the hinge 85.

Figure 19:
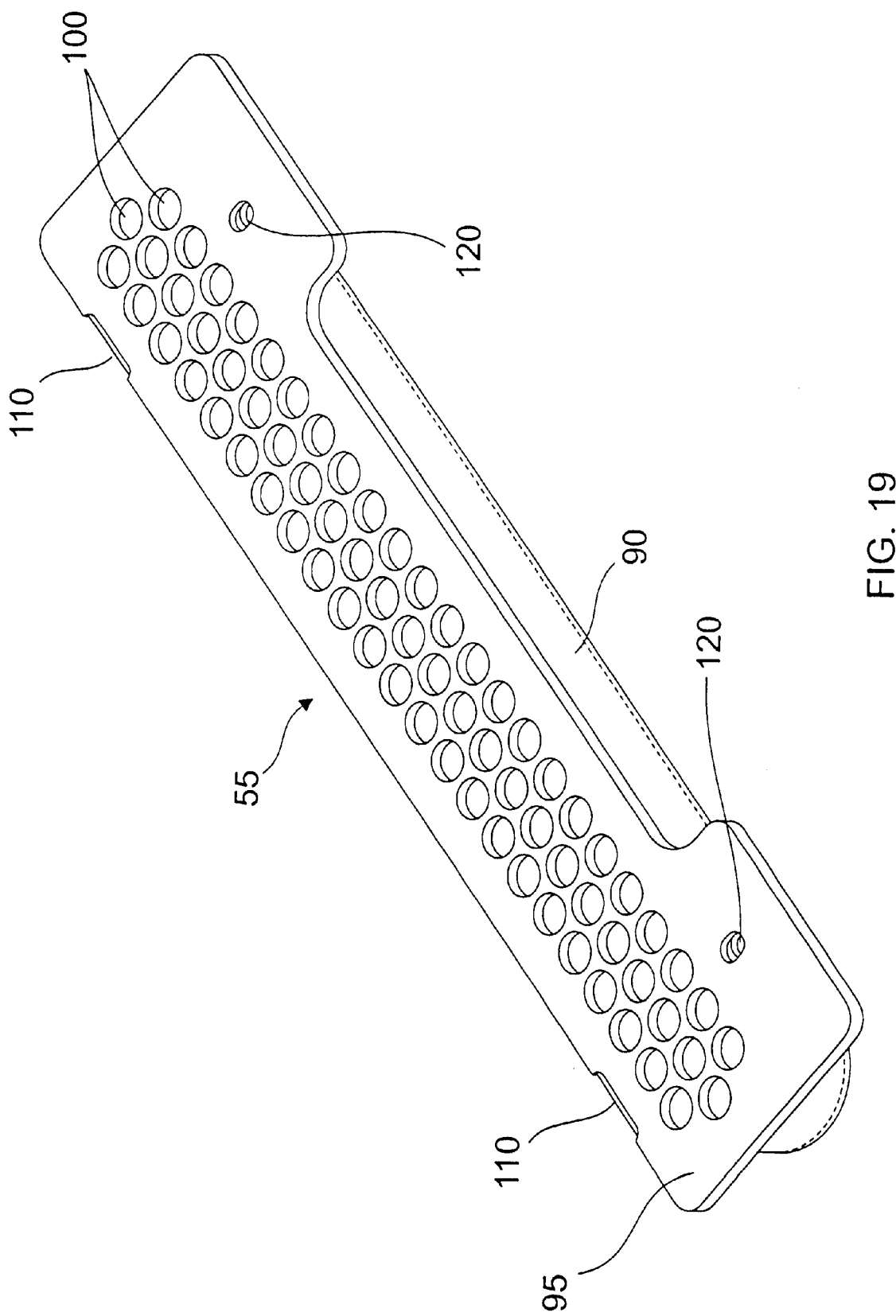
FIG. 19 is a perspective view of a commercially available embodiment of an intermediate receptacle or cassette used in the apparatus of FIGS. 14 through 18.

Referring to FIG. 19, a perspective view of the Multicore DISC cassette, item 55, is shown. The cassette 55 includes two main parts, a paste reservoir 90, which holds the solder paste, and a base 95. The paste reservoir 90 comprises a flexible case, preferably made of collapsible plastic, which is attached and sealed to the base 95. The base 95 is preferably made of a rigid material such as hard plastic and contains a plurality of apertures 100 through which the solder paste is able to pass. The apertures 100 are all of the same size and are made according to a constant spacing and pitch. The base 95 acts as a homogenizing or mixing device by dividing the material via the apertures to ensure that the correct rheological properties of the material are maintained. When sold, the base 95 and the apertures 100 are covered by a peelable strip, which is removed prior to insertion of the cassette 55 into the transfer head 65 in the manner to be described below. The flexible nature of the paste reservoir 90 allows for an operator to knead the solder paste if the paste has been left for a long time or if any separation has occurred.

Figure 15:
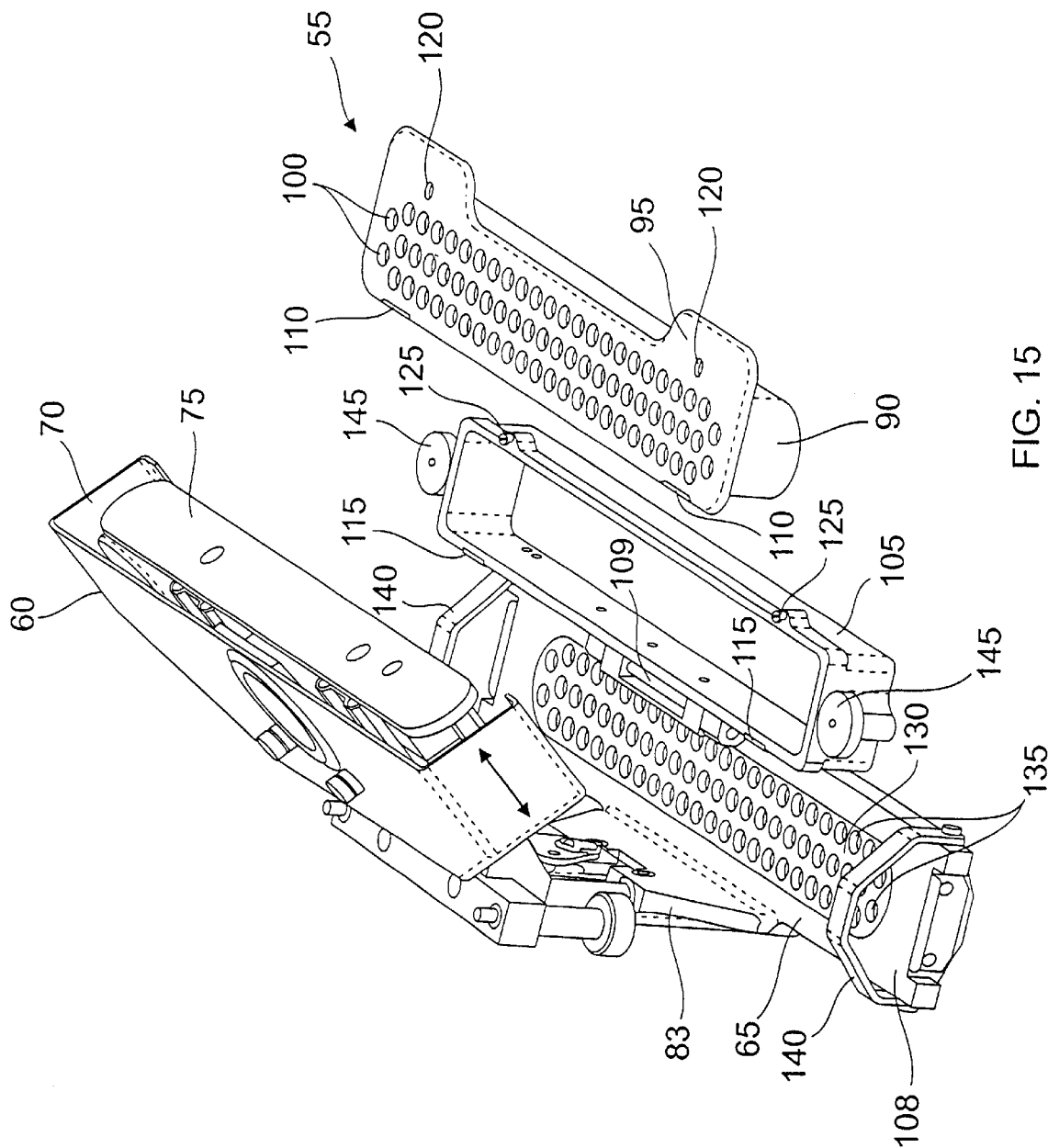
FIGS. 15 through 18 are perspective views of the commercially available embodiment shown in FIG. 14, where the apparatus is in the open position.
Figure 16:
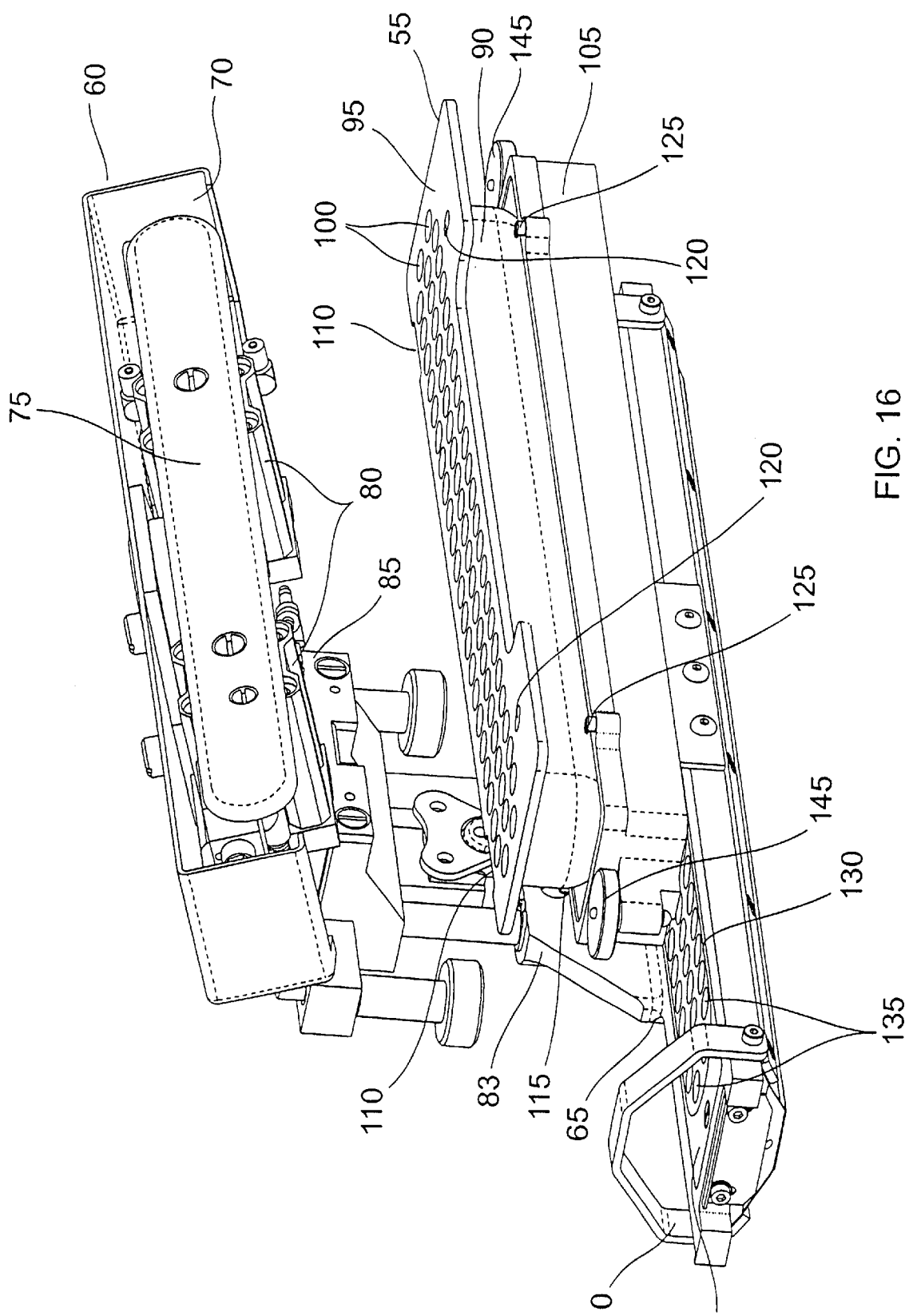
Figure 17:
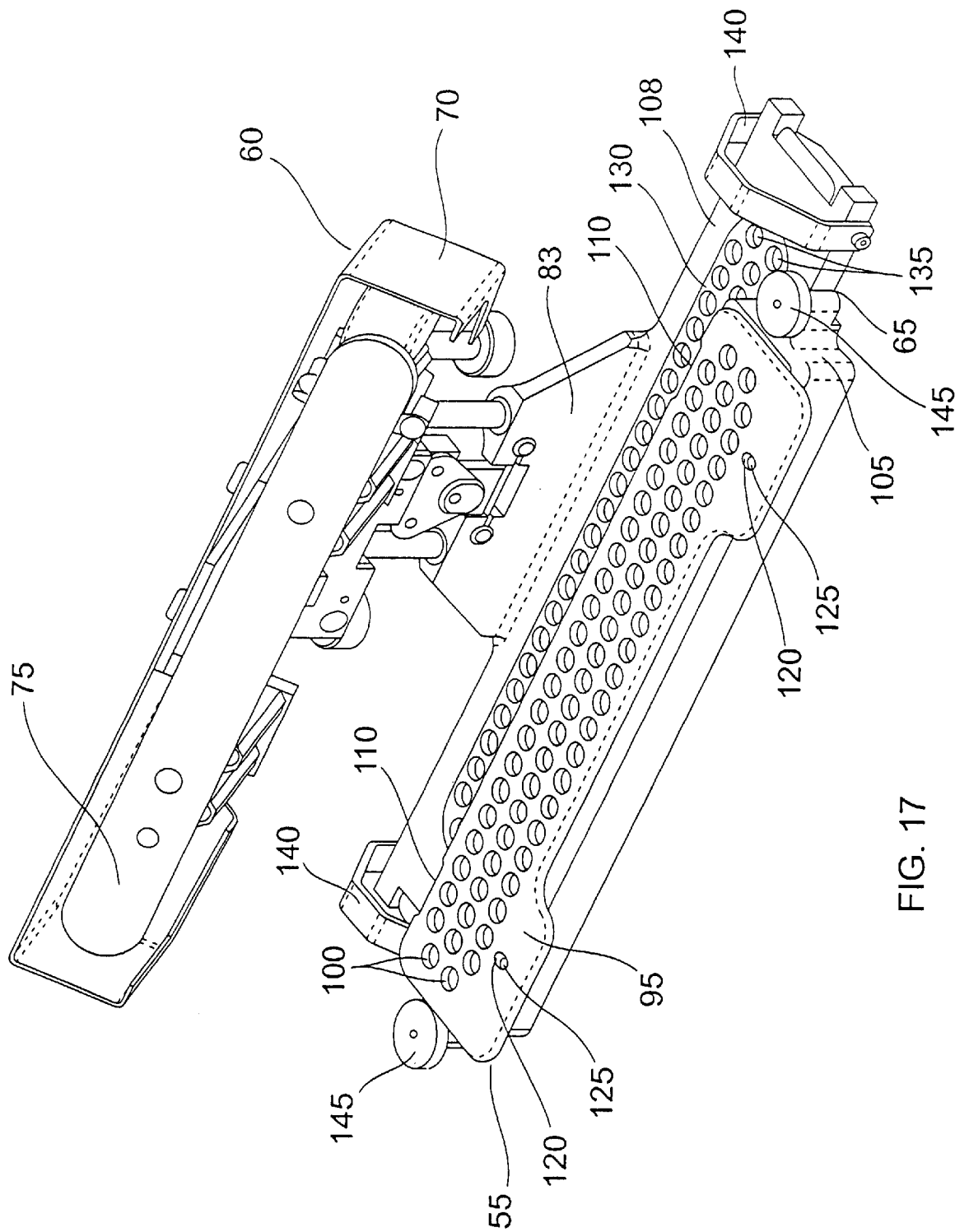

As shown in FIGS. 15 through 17, the cassette 55 is loaded into the transfer head 65 by first inserting the cassette 55 into housing 105. Housing 105 is attached to transfer base 108 by way of a hinge 109, the significance of which will be apparent below. In order to secure cassette 55 to housing 105, indentations 110 formed in base 95 slide under clips 115 and apertures 120 formed in base 95 fit over pegs 125. Both clips 115 and pegs 125 are attached to housing 105.

Figure 18:
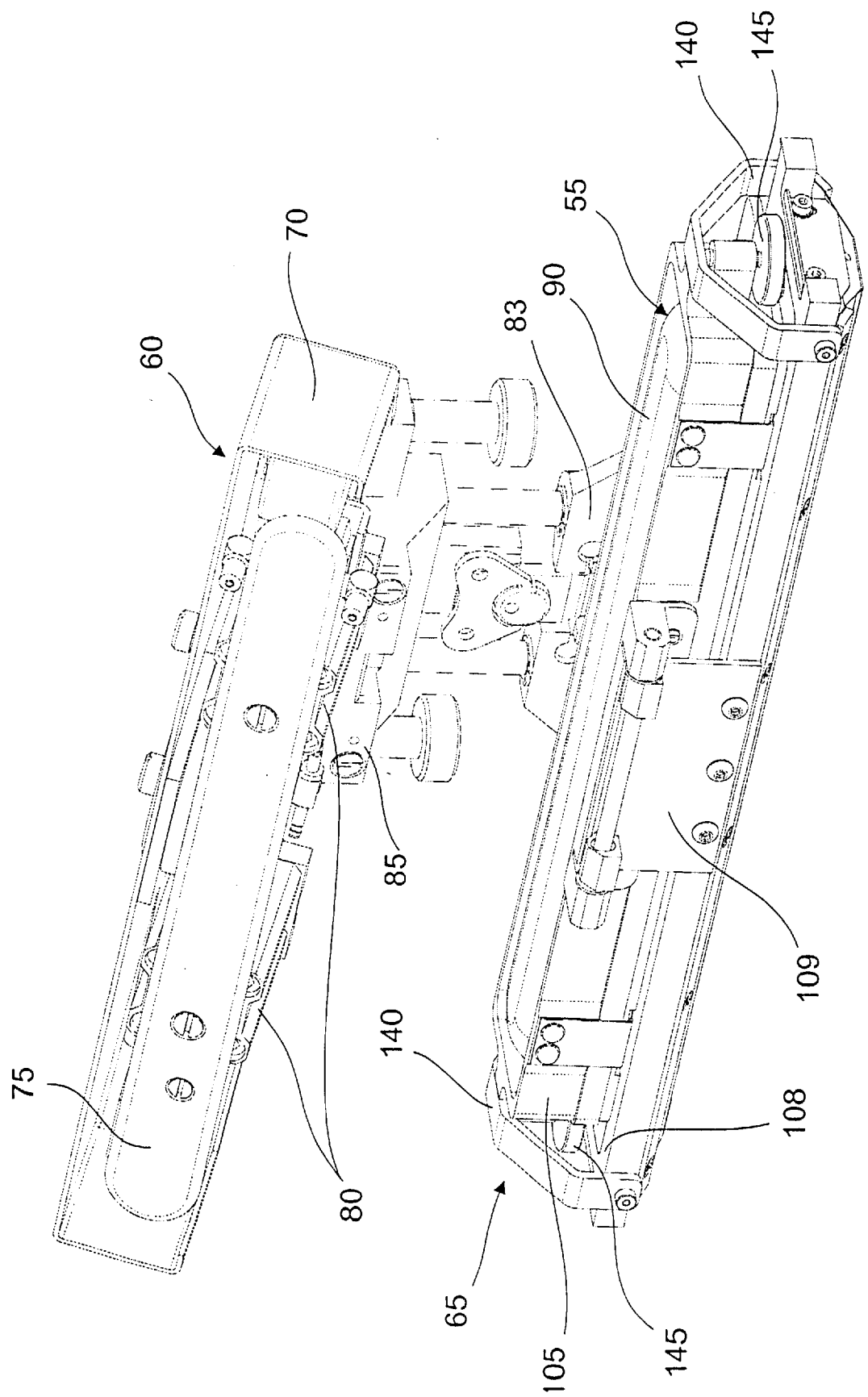

Thus, housing 105 can be moved from an open position, shown in FIGS. 15 through 17, to a closed position, shown in FIG. 18, by rotating housing 105 on hinge 109. In the closed position, base 95 of the cassette 55 is in direct contact with the top side of transfer base 108. In particular, the transfer base 108 contains on the top side thereof a grille 130 having a plurality of apertures 135 which are sized and spaced such that they directly align with the apertures 100 formed in base 95 when the housing 105 is in the closed position. The transfer base 108 includes clips 140, rotatably attached thereto. Thus, the housing 105 containing the cassette 55 is able to be secured in place in the closed position by rotating the clips 140 over the longitudinal end portions of the housing 105 and by tightening screws 145 affixed to the longitudinal end portions of the housing 105 against the undersides of the clips 140. As can be seen from the above description, no tools are required during any of the stages of fitting the cassette 55 into the transfer head 65. Once the cassette 55 is securely fitted into the transfer head 65, the pressure assembly 60 is moved down into the closed position as described above.

Figure 1:
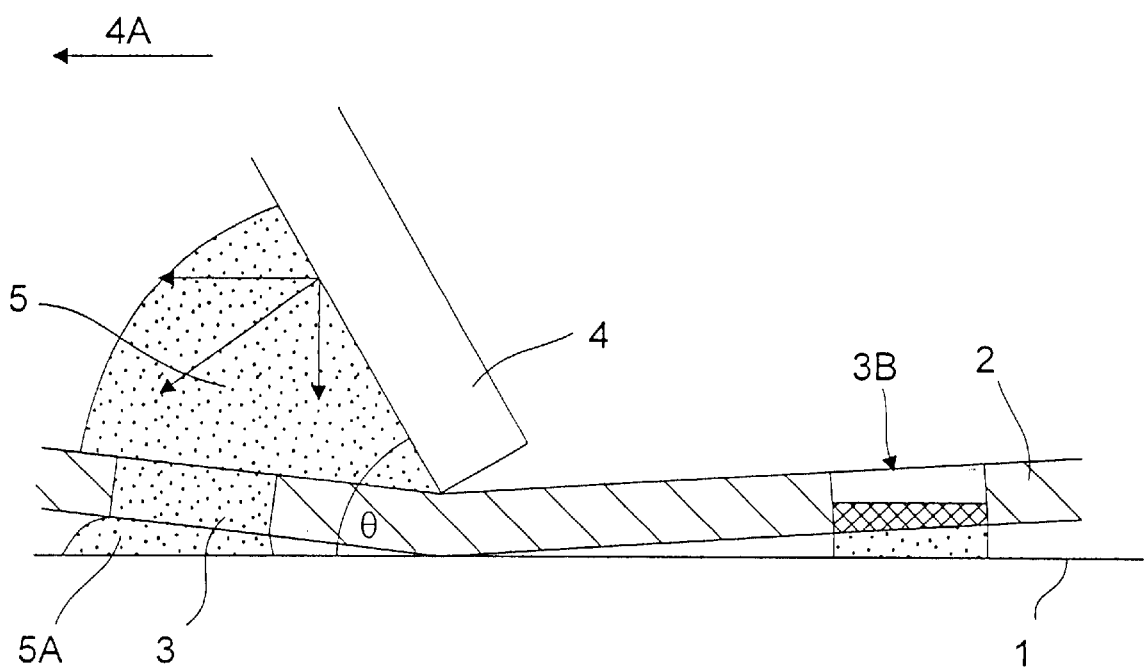
FIG. 1 schematically shows an operation of deposition of a paste like or viscous material by screen printing according to the prior art.
Figure 20:
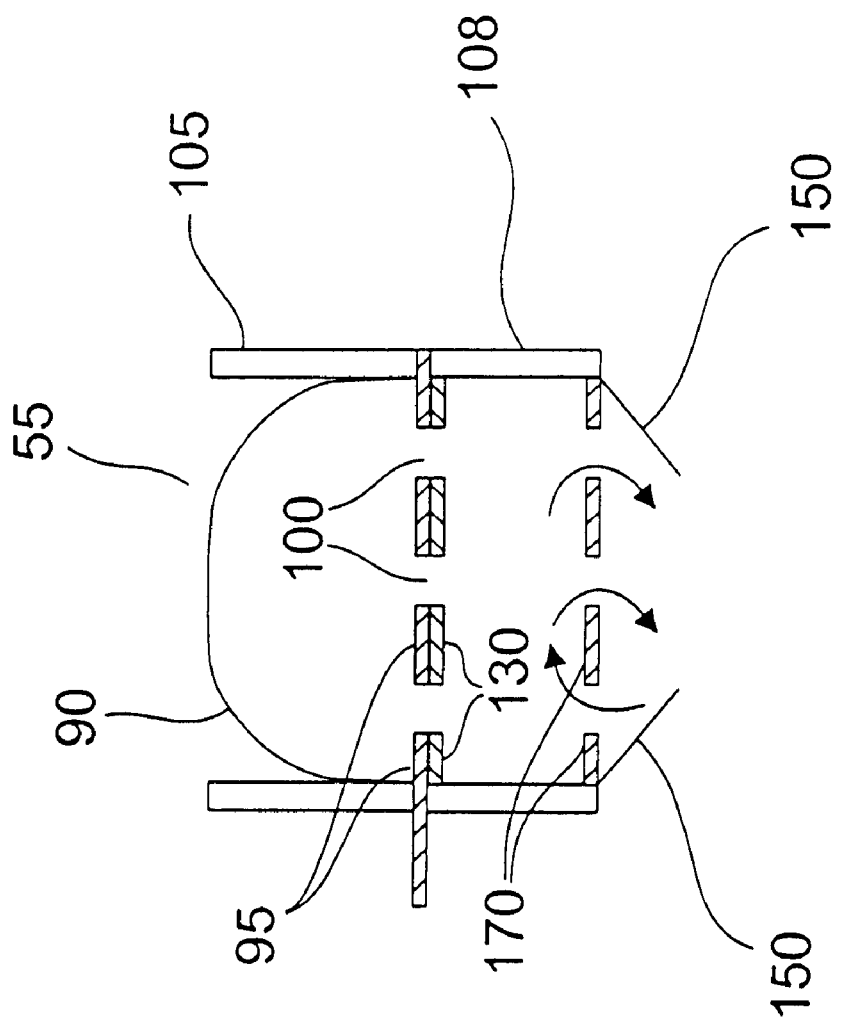
FIG. 20 is a cross sectional view of the transfer head shown in FIGS. 14 through 19.
Figure 21:
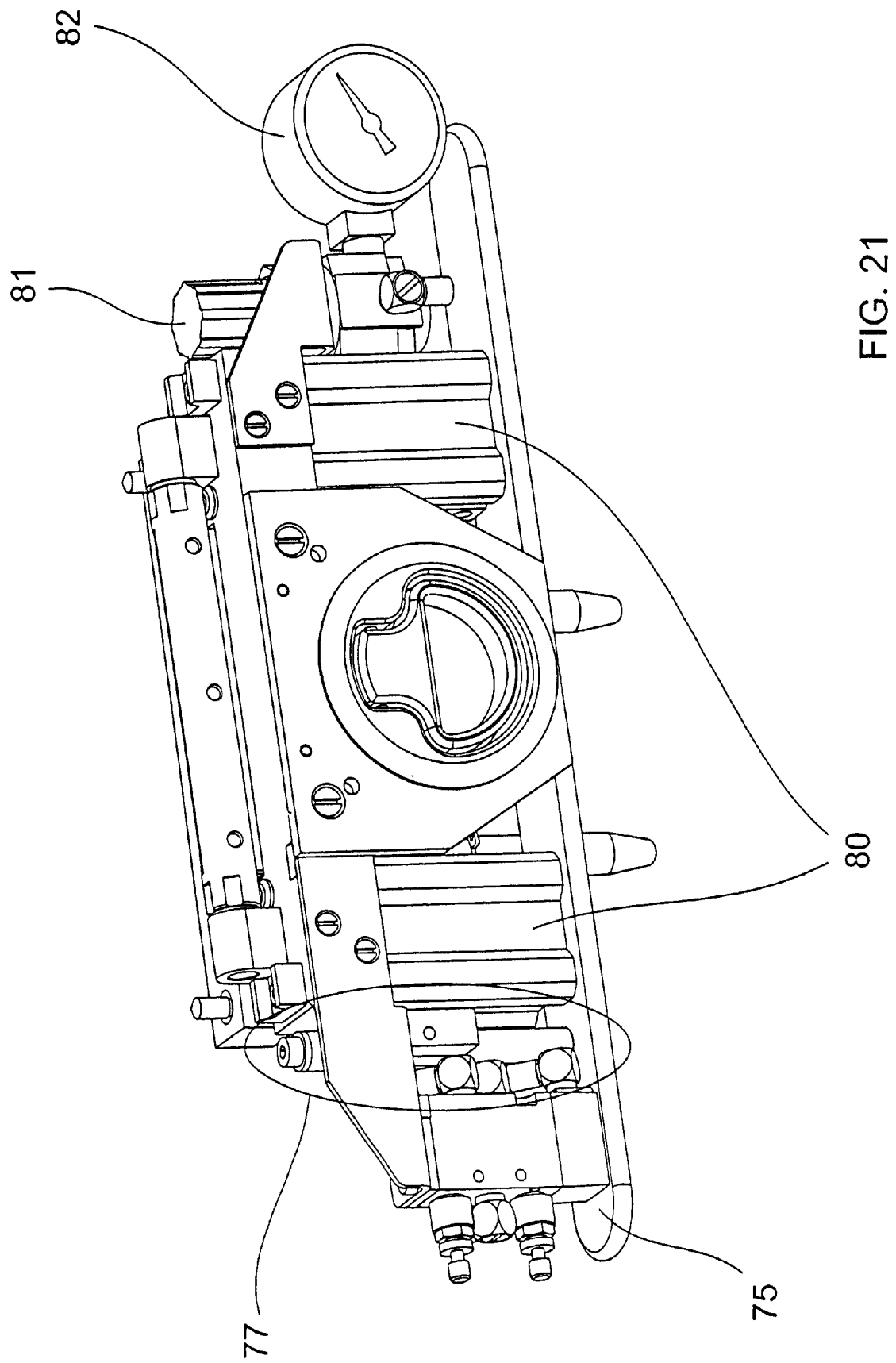
FIG. 21 is a perspective view of the pressure assembly of the commercially available embodiment shown in FIGS. 14 through 18, where the cover is removed.

Referring to FIG. 14, the underside of transfer base 108 can be seen, which includes wipers 150, sealing members 160, and grille 170. Thus, as apparatus 50 is displaced along the surface of the substrate 1 and stencil 2 with the pressure assembly 60 in the closed position (FIG. 14), the driving mechanism 80 moves the cross-head plate 75 in a downward direction such that a pressure is applied to the paste reservoir 90 of cassette 55. The cross-head plate 75 is preferably made of a flat planar body the dimensions of which are substantially equal to the dimensions of the cassette 55, in particular the paste reservoir 95. As a result, the solder paste is forced through the apertures 100 in base 95, through the apertures 135 in the grille 130 and ultimately through the grille 170. As shown in FIG. 21, a sensor assembly 77 is mounted between cross-head plate 75 and cylinders 80 which senses when the cross-head plate 75 is forced fully down against base 95 and thus when the cassette 55 is fully discharged. The solder paste is thus deposited on the stencil through the aperture 190 delimited by the wipers 150, and the sealing members 160. As described in greater detail above, as the apparatus 50 is moved back and forth either along the substrate and stencil, the wipers 150 constantly detach and lift any excess material which remains in the zone delimited by the grille 170 the wipers 150 and the sealing members 160, and therefore leaves the stencil clean and eliminates waste. As a result, material is not left on the stencil to dry. Furthermore, as shown in FIG. 20, as the material is detached and lifted, it is constantly passed up through the grille 170 and back down through the grille 170 as shown by the rotational arrows. Thus, the material is constantly rotated and homogenised which results in the material having proper rheological qualities. Also, the material is contained within the zone delimited by the grille 170 the wipers 150 and the sealing members 160, thereby preventing the formation of "tram-lines" that resulted in the prior art systems. Furthermore, the material is always behind a point of contact between one of the wipers 150 and the stencil and therefore prevents the material from passing under the stencil as is shown in FIG. 1.

Our invention is defined by the following claims:

1. A method for depositing a viscous material onto a substrate through openings formed in a stencil positioned over the substrate, said method comprising the steps of:
   providing a receptacle having a top and a bottom and at least one longitudinal side, said bottom having an aperture;
   providing a wiper attached to said bottom of said receptacle along said longitudinal side, wherein said wiper is inclined at an angle with respect to a plane that is parallel to said bottom of said receptacle;
   placing the viscous material into an intermediate receptacle having at least one aperture formed in a bottom side thereof;
   inserting said intermediate receptacle into said receptacle;
   applying a pressure and moving the viscous material toward said at least one aperture formed in said bottom side of said intermediate receptacle, and toward said aperture in said bottom of said receptacle, wherein the viscous material is pushed against said wiper such that said wiper is pushed against the stencil; and
   displacing said receptacle, said intermediate receptacle, and said wiper along the stencil in a direction substantially perpendicular to said longitudinal side of said receptacle;
   wherein an excess amount of viscous material left on the stencil is detached and lifted by said wiper and mixed with the viscous material being moved toward said aperture.

2. The method of claim 1, further comprising pushing said excess amount of viscous material up into said intermediate receptacle through said aperture in said bottom of said receptacle, and through said at least one aperture formed in said bottom side of said intermediate receptacle, such that said excess amount of viscous material is rolled in an area above and below said aperture in said bottom of said receptacle.

3. The method of claim 1, wherein during said applying step the viscous material is forced through a grille having a plurality of apertures in a first direction, said method further comprising passing said excess amount of viscous material through said grille in a second direction substantially opposite to said first direction.

4. The method of claim 1, wherein a surface of said wiper is inclined at an angle between 120° and 180° with respect to a plane that is substantially parallel to a surface of the stencil.

5. The method of claim 1, wherein the viscous material is moved toward said aperture by at least one piston.

6. A method for depositing a viscous material onto a substrate through openings formed in a stencil positioned over the substrate, said method comprising the steps of:
   placing the viscous material into a receptacle having a bottom and first and second longitudinal sides, said bottom having an aperture;
   providing a first wiper attached to said bottom of said receptacle at said first longitudinal side, and a second wiper attached to said bottom of said receptacle at said second longitudinal side, wherein said first and second wipers are inclined at an angle with respect to a plane that is parallel to said bottom of said receptacle;
   applying a pressure to the viscous material and moving the viscous material toward said aperture, wherein when the viscous material is moved toward said aperture the viscous material is pushed against said first and second wipers such that said first and second wipers are pushed against the stencil; and
   displacing said receptacle and said first and second wipers along the stencil in a direction substantially perpendicular to said first longitudinal side of said receptacle;
   wherein an excess amount of viscous material left on the stencil is detached and lifted by one of said first and said second wipers and mixed with the viscous material being moved toward said aperture.

7. The method of claim 6, wherein during said applying step said excess amount of viscous material is forced through a grille having a plurality of apertures.

8. The method of claim 6, further comprising pushing said excess amount of viscous material up into said receptacle through said aperture, such that said excess amount of viscous material is rolled in an area above and below said aperture.

9. The method of claim 6, wherein during said applying step the viscous material is forced through a grille having a plurality of apertures in a first direction, said method further comprising passing said excess amount of viscous material through said grille in a second direction substantially opposite to said first direction.

10. The method of claim 6, wherein a surface of said at least one wiper is inclined at an angle between 120° and 180° with respect to a plane that is substantially parallel to a surface of the stencil.

11. The method of claim 6, wherein the viscous material is moved toward said aperture by at least one piston.

12. A method for depositing a viscous material onto a substrate through openings formed in a stencil positioned over the substrate, said method comprising the steps of:
   providing a receptacle having a bottom and first and second longitudinal sides, said bottom having an aperture;
   providing a first wiper attached to said bottom of said receptacle at said first longitudinal side, and a second wiper attached to said bottom of said receptacle at said second longitudinal side, wherein said first and second wipers are inclined at an angle with respect to a plane that is parallel to said bottom of said receptacle;
   placing the viscous material into an intermediate receptacle having at least one aperture formed in a bottom side thereof;
   inserting said intermediate receptacle into said receptacle;
   applying a pressure to the viscous material and moving the viscous material toward said at least one aperture formed in said bottom side of said intermediate receptacle, and toward said aperture in said bottom of said receptacle, wherein the viscous material is pushed against said first and second wipers such that said first and second wipers are pushed against the stencil; and
   displacing said receptacle and said intermediate receptacle and said first and second wipers along the stencil in a direction substantially perpendicular to said longitudinal side of said receptacle;
   wherein an excess amount of viscous material left on the stencil is detached and lifted by one of said first and said second wipers and mixed with the viscous material being moved toward said aperture.

13. The method of claim 12, wherein during said applying step the viscous material is forced through a grille having a plurality of apertures.

14. The method of claim 12, further comprising pushing said excess amount of viscous material up into said intermediate receptacle through said aperture in said bottom of said receptacle, and through said at least one aperture formed in said bottom side of said intermediate receptacle, such that said excess amount of viscous material is rolled in an area above and below said aperture in said bottom of said receptacle.

15. The method of claim 12, wherein during said applying step the viscous material is forced through a grille having a plurality of apertures in a first direction, said method further comprising passing said excess amount of viscous material through said grille in a second direction substantially opposite to said first direction.

16. A method for depositing a viscous material onto a substrate through openings formed in a stencil positioned over the substrate, said method comprising:
   placing the viscous material into a receptacle having an aperture;
   moving the viscous material toward said aperture;
   attaching at least one inclined wiper to said receptacle at a position adjacent the stencil;
   displacing said apparatus along the stencil positioned over the substrate;
   detaching and lifting an excess amount of viscous material left on the stencil by using said at least one wiper.

17. The method of claim 16, wherein a surface of said at least one inclined wiper is inclined at an angle between 120° and 180° with respect to a plane that is substantially parallel to a surface of the stencil.

18. The method of claim 16, wherein the viscous material is moved toward said aperture by at least one piston.

19. A method for depositing a viscous material onto a substrate through openings formed in a stencil positioned over the substrate, said method comprising the steps of:
   providing a receptacle having a top and a bottom and at least one longitudinal side, said bottom having an aperture;
   providing a wiper attached to said bottom of said receptacle along said longitudinal side, wherein said wiper is inclined at an angle with respect to a plane that is parallel to said bottom of said receptacle;
   placing the viscous material into an intermediate receptacle having at least one aperture formed in a bottom side thereof;
   inserting said intermediate receptacle into said receptacle;
   applying a pressure and moving the viscous material toward said at least one aperture formed in said bottom side of said intermediate receptacle, and toward said aperture in said bottom of said receptacle, wherein the viscous material is pushed against said wiper such that said wiper is pushed against the stencil; and
   displacing said receptacle, said intermediate receptacle, and said wiper along the stencil in a direction substantially perpendicular to said longitudinal side of said receptacle;
   wherein an excess amount of viscous material left on the stencil is detached and lifted by said wiper and pushed up into said intermediate receptacle through said aperture in said bottom of said receptacle, and through said at least one aperture formed in said bottom side of said intermediate receptacle, such that said excess amount of viscous material is rolled in an area above and below said aperture in said bottom of said receptacle.

20. The method of claim 19, wherein during said applying step the viscous material is forced through a grille having a plurality of apertures in a first direction, said method further comprising passing said excess amount of viscous material through said grille in a second direction substantially opposite to said first direction.

21. A method for depositing a viscous material onto a substrate through openings formed in a stencil positioned over the substrate, said method comprising the steps of:
   placing the viscous material into a receptacle having a bottom and first and second longitudinal sides, said bottom having an aperture;
   providing a first wiper attached to said bottom of said receptacle at said first longitudinal side, and a second wiper attached to said bottom of said receptacle at said second longitudinal side, wherein said first and second wipers are inclined at an angle with respect to a plane that is parallel to said bottom of said receptacle;
   applying a pressure to the viscous material and moving the viscous material toward said aperture, wherein when the viscous material is moved toward said aperture the viscous material is pushed against said first and second wipers such that said first and second wipers are pushed against the stencil; and
   displacing said receptacle and said first and second wipers along the stencil in a direction substantially perpendicular to said first longitudinal side of said receptacle;
   wherein an excess amount of viscous material left on the stencil is detached and lifted by one of said first and said second wipers and pushed up into said receptacle through said aperture, such that said excess amount of viscous material is rolled in an area above and below said aperture.

22. The method of claim 21, wherein during said applying step said excess amount of viscous material is forced through a grille having a plurality of apertures.

23. The method of claim 21 wherein during said applying step the viscous material is forced through a grille having a plurality of apertures in a first direction, said method further comprising passing said excess amount of viscous material through said grille in a second direction substantially opposite to said first direction.

24. A method for depositing a viscous material onto a substrate through openings formed in a stencil positioned over the substrate, said method comprising the steps of:
   providing a receptacle having a bottom and first and second longitudinal sides, said bottom having an aperture;
   providing a first wiper attached to said bottom of said receptacle at said first longitudinal side, and a second wiper attached to said bottom of said receptacle at said second longitudinal side, wherein said first and second wipers are inclined at an angle with respect to a plane that is parallel to said bottom of said receptacle;
   placing the viscous material into an intermediate receptacle having at least one aperture formed in a bottom side thereof;
   inserting said intermediate receptacle into said receptacle;
   applying a pressure to the viscous material and moving the viscous material toward said at least one aperture formed in said bottom side of said intermediate receptacle, and toward said aperture in said bottom of said receptacle, wherein the viscous material is pushed against said first and second wipers such that said first and second wipers are pushed against the stencil; and displacing said receptacle and said intermediate receptacle and said first and second wipers along the stencil in a direction substantially perpendicular to said longitudinal side of said receptacle;

wherein an excess amount of viscous material left on the stencil is detached and lifted by one of said first and said second wipers and pushed through said aperture in said bottom of said receptacle, and through said at least one aperture formed in said bottom side of said intermediate receptacle, such that said excess amount of viscous material is rolled in an area above and below said aperture in said bottom of said receptacle.

25. The method of claim 24 herein during said applying step the viscous material is forced through a grille having a plurality of apertures.

26. The method of claim 24 wherein during said applying step the viscous material is forced through a grille having a plurality of apertures in a first direction, said method further comprising passing said excess amount of viscous material through said grille in a second direction substantially opposite to said first direction.

* * * * *